(12) United States Patent
Vali et al.

(10) Patent No.: US 10,714,196 B2
(45) Date of Patent: Jul. 14, 2020

(54) METHODS FOR DETERMINING DATA STATES OF MEMORY CELLS

(71) Applicant: MICRON TECHNOLOGY, INC., Boise, ID (US)

(72) Inventors: Tommaso Vali, Sezze (IT); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/152,897

(22) Filed: Oct. 5, 2018

(65) Prior Publication Data

US 2020/0111534 A1    Apr. 9, 2020

(51) Int. Cl.
  *G11C 16/04* (2006.01)
  *G11C 16/34* (2006.01)
  *G11C 16/26* (2006.01)
  *G11C 16/08* (2006.01)
  *G11C 16/32* (2006.01)

(52) U.S. Cl.
  CPC .......... *G11C 16/3431* (2013.01); *G11C 16/08* (2013.01); *G11C 16/26* (2013.01); *G11C 16/0483* (2013.01); *G11C 16/32* (2013.01)

(58) Field of Classification Search
  CPC ..... G11C 16/3431; G11C 16/08; G11C 16/26; G11C 16/0483; G11C 16/32
  See application file for complete search history.

(56) References Cited

U.S. PATENT DOCUMENTS

| | | | |
|---|---|---|---|
| 9,779,819 B1 * | 10/2017 | Tang | G11C 16/10 |
| 10,062,441 B1 | 8/2018 | Vali et al. | |
| 2019/0027225 A1 * | 1/2019 | Hioka | G11C 16/30 |
| 2019/0252030 A1 * | 8/2019 | Yang | G11C 16/3459 |

* cited by examiner

*Primary Examiner* — Uyen Smet
(74) *Attorney, Agent, or Firm* — Dicke, Billig & Czaja, PLLC

(57) ABSTRACT

Methods of operating a memory might include sensing a state of each data line of a plurality of data lines while increasing a voltage level applied to each access line of a plurality of access lines commonly connected to a plurality of strings of series-connected memory cells, determining a particular voltage level at which the state of each data line of a first subset of the plurality of data lines has changed, decreasing a voltage level applied to a particular access line of the plurality of access lines, and sensing a state of each data line of a second subset of the plurality of data lines while applying the particular voltage level to the particular access line. Methods of operating a memory might further include determining a pass voltage and plurality of read voltages for a read operation during a precharge phase of the read operation, applying the pass voltage to each unselected access line of a plurality of access lines, and, for each read voltage of the plurality of read voltages, applying that read voltage to a selected access line of the plurality of access lines and sensing a data state of a memory cell connected to the selected access line.

24 Claims, 16 Drawing Sheets

FIG. 3

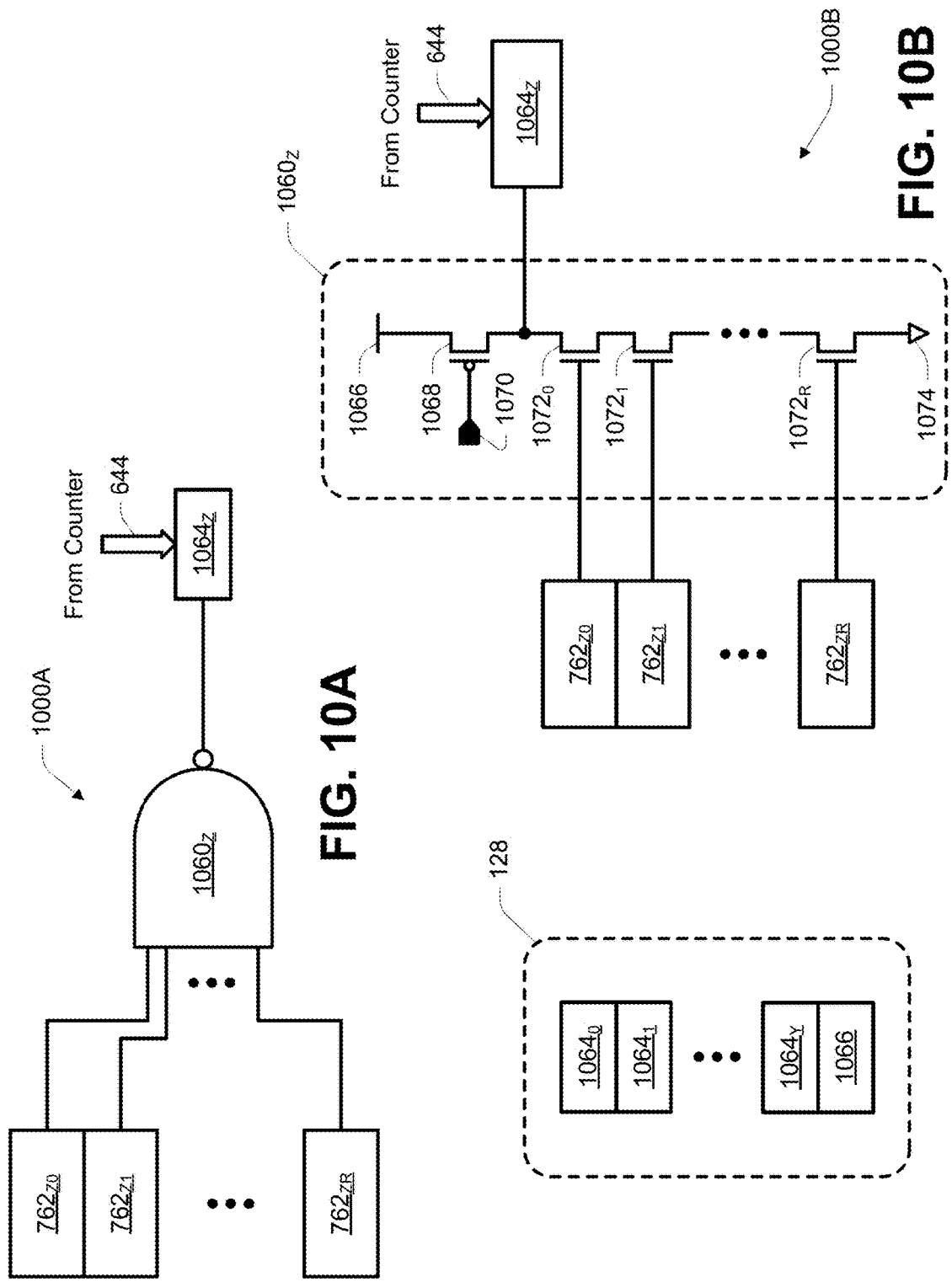

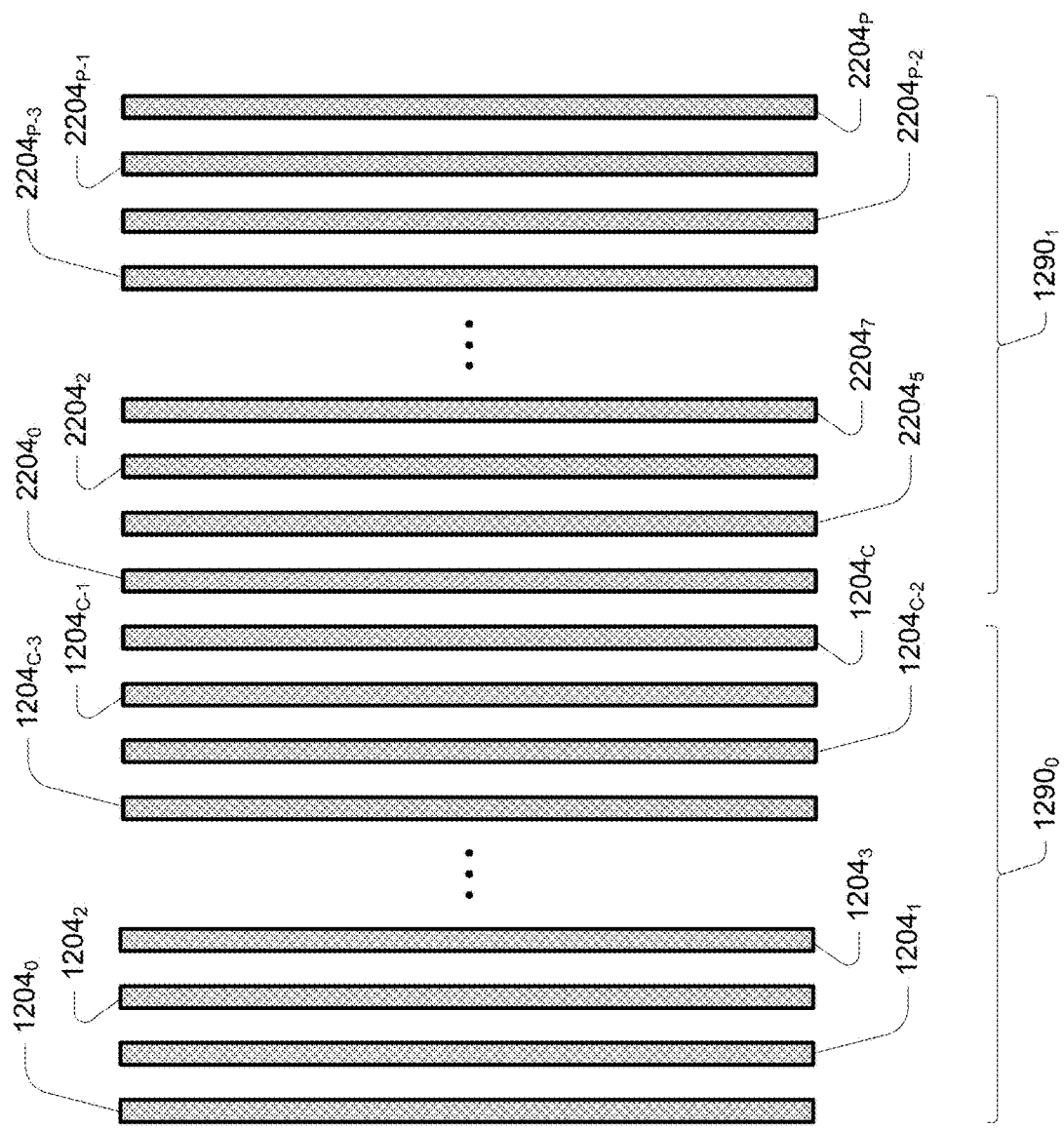

METHODS FOR DETERMINING DATA STATES OF MEMORY CELLS

TECHNICAL FIELD

The present disclosure relates generally to memory and, in particular, in one or more embodiments, the present disclosure relates to apparatus and methods for determining data states of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

BRIEF DESCRIPTION OF THE DRAWINGS

FIG. 3 is a block schematic of a portion of an array of memory cells as could be used in a memory of the type described with reference to FIG. 1.

FIGS. 10A-10B are block schematics of decoding circuitry for use in determining read voltages using more than one canary NAND string for a corresponding data state in accordance with embodiments.

FIG. 11 is a block schematic of a register bank in accordance with embodiments.

FIG. 12 is a block diagram of data lines in accordance with an embodiment.

DETAILED DESCRIPTION

Figure 1:
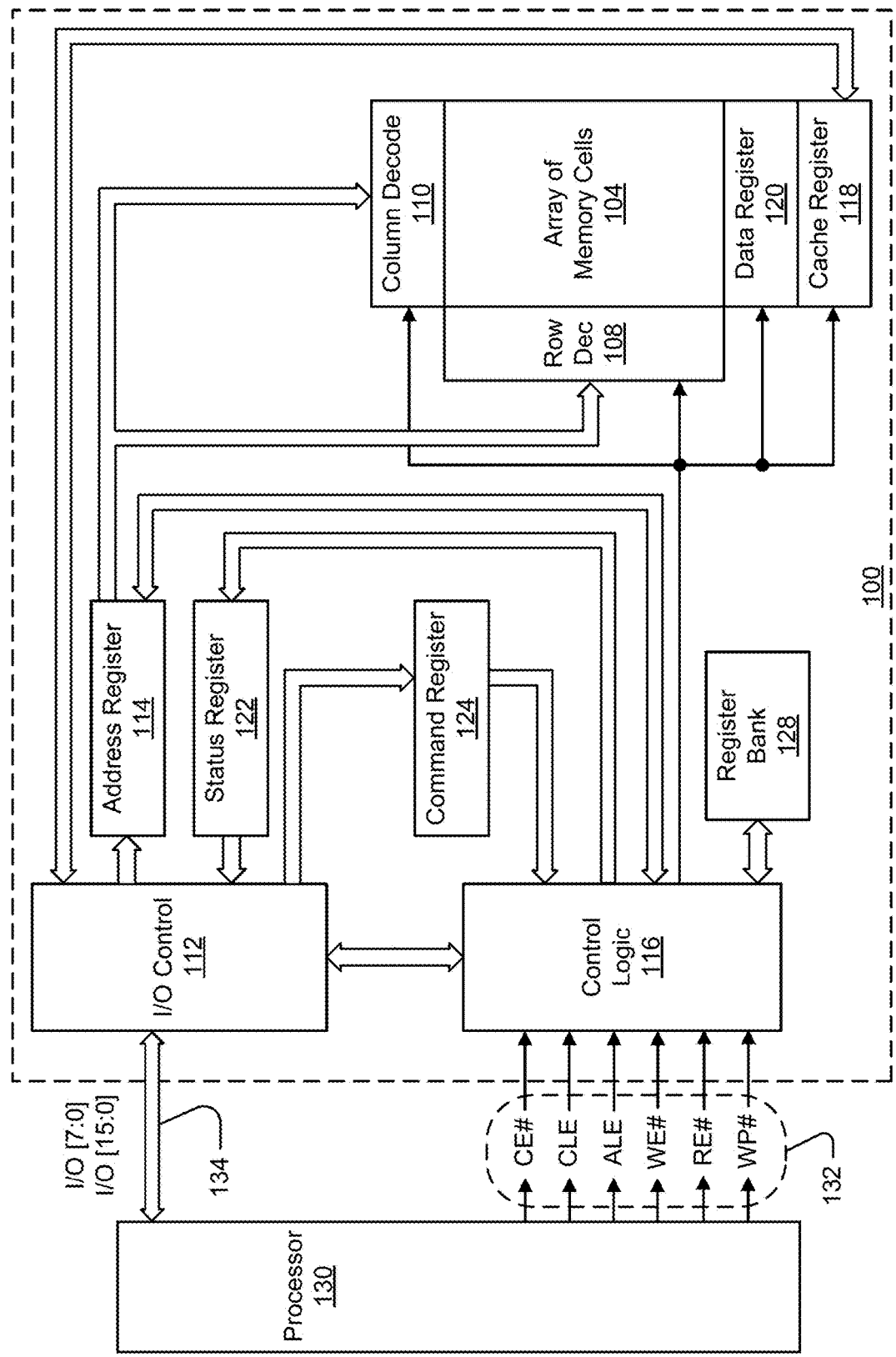
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A register bank 128 may be in communication with the control logic 116. The register bank 128 might represent a volatile memory, latches or other storage location. For some embodiments, the register bank 128 might represent a portion of the array of memory cells 104. The register bank 128 might store information relating to threshold voltages (e.g., highest threshold voltages) for groupings of memory cells in accordance with embodiments. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120.

Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
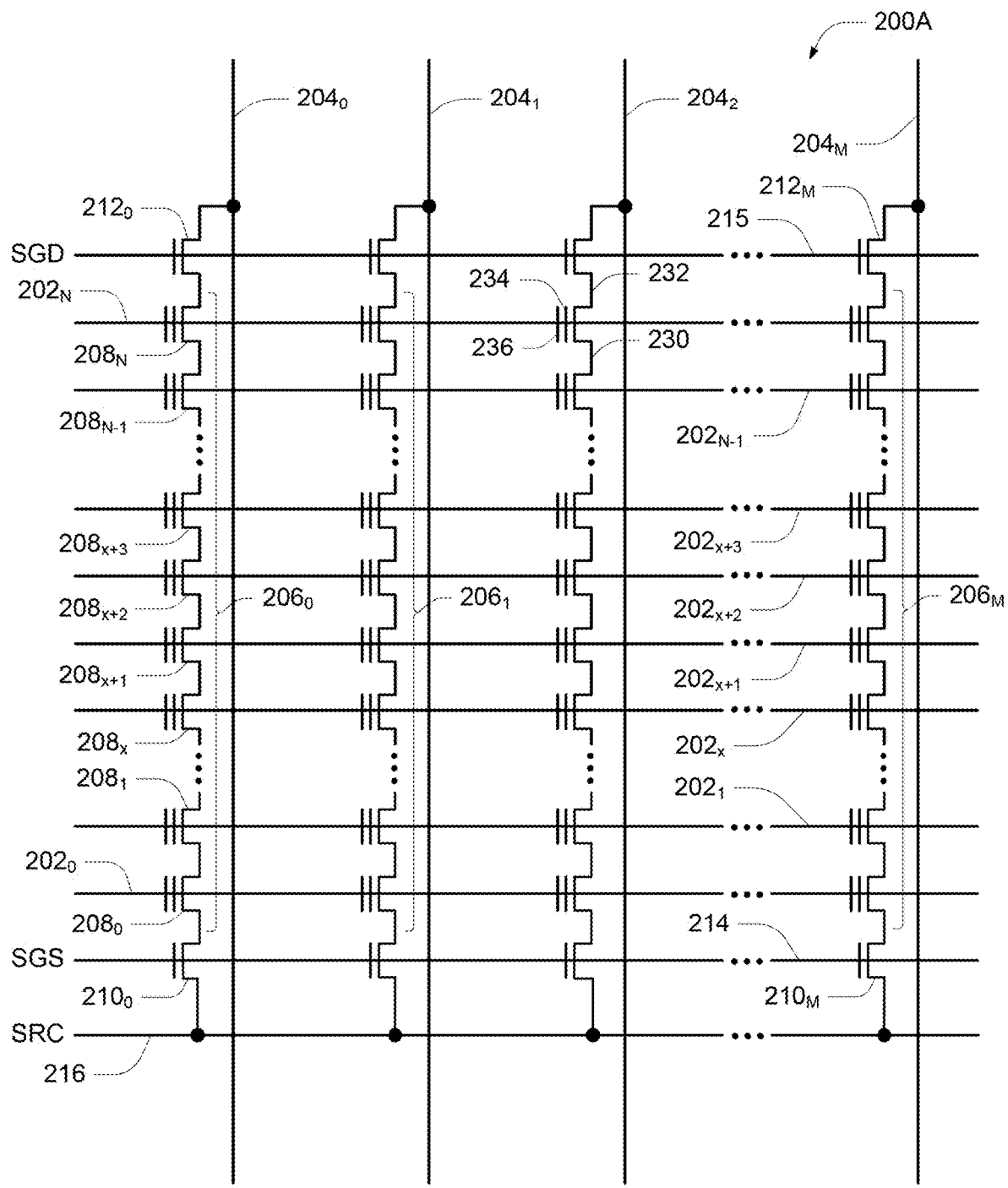
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
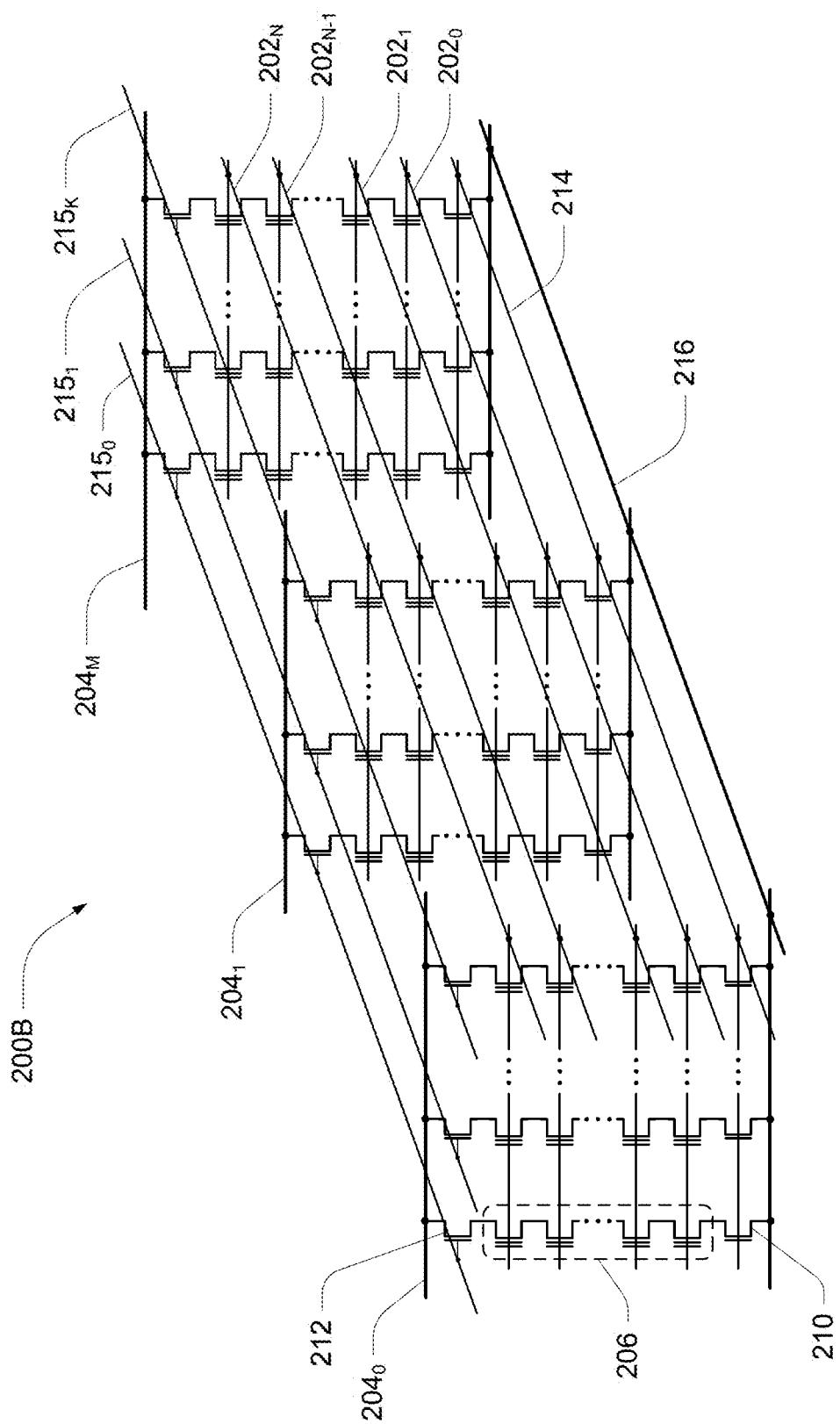

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
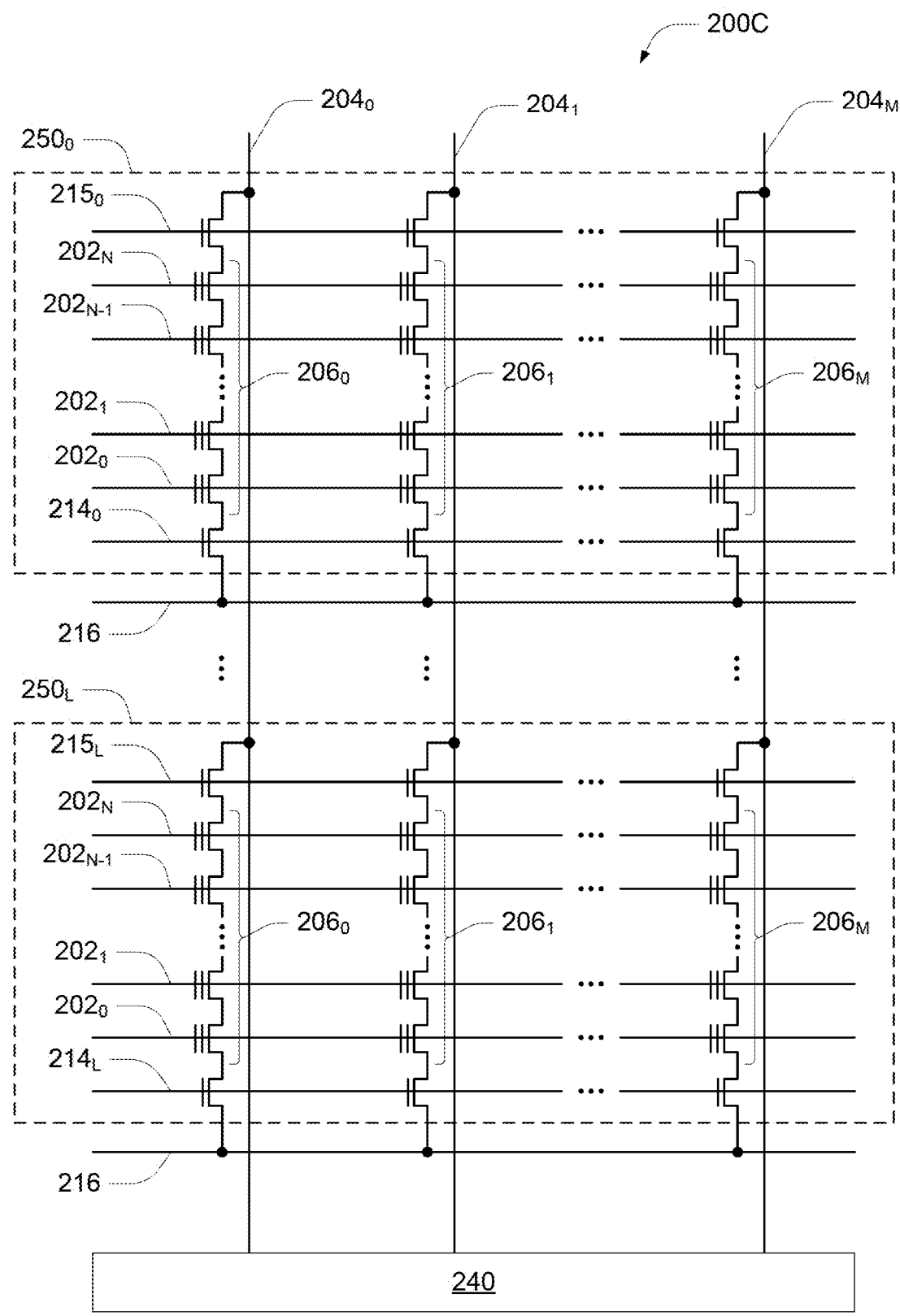

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown) for sensing data values indicated on respective data lines 204, and corresponding registers (not shown) for storage of the sensed data values from its corresponding memory plane.

Figure 3:
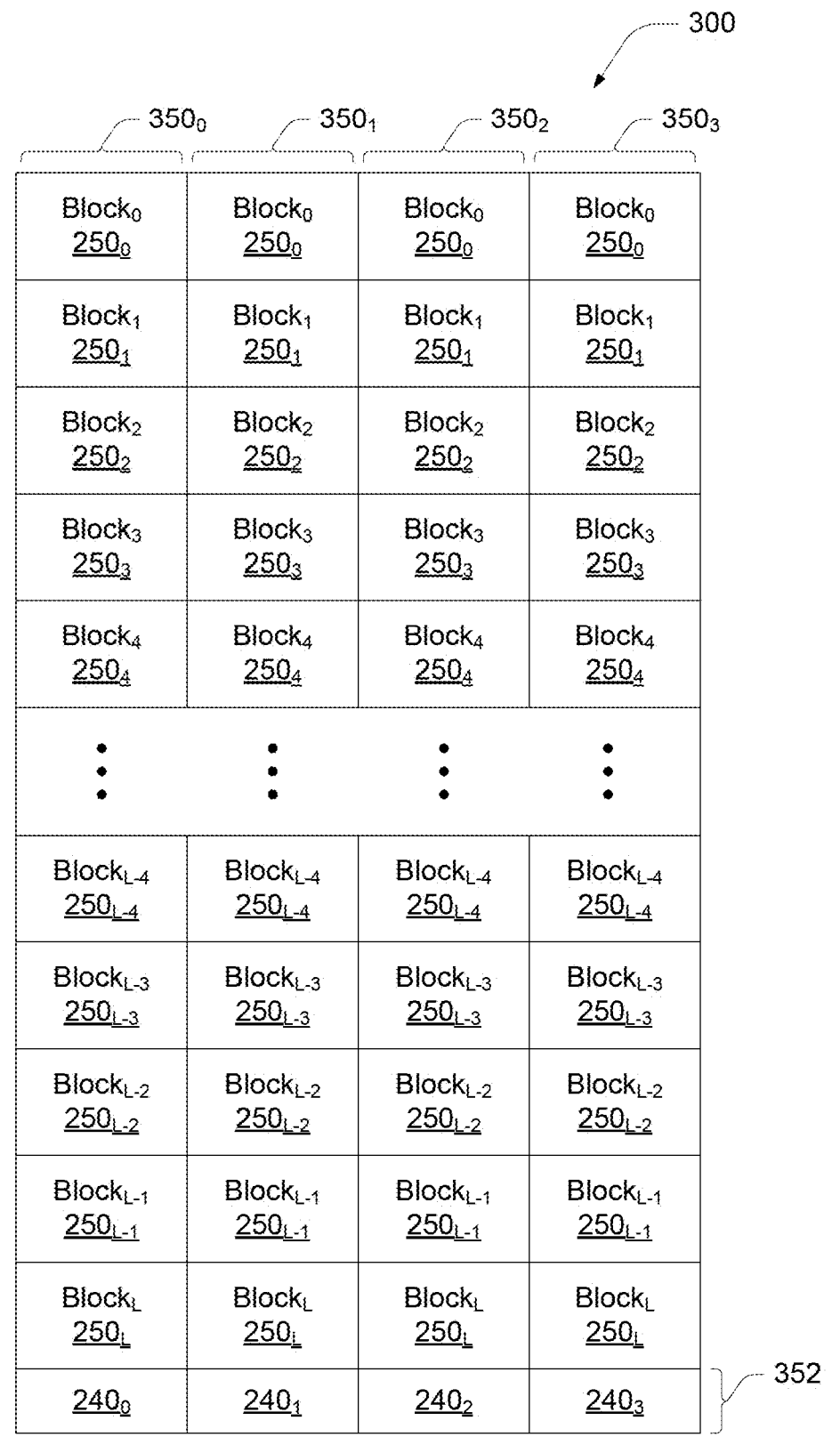

FIG. 3 is a block schematic of a portion of an array of memory cells as could be used in a memory of the type described with reference to FIG. 1. The array of memory cells 300 is depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L+1 blocks of memory cells 250 (e.g., blocks of memory cells $250_0$-$250_L$).

Figure 4:
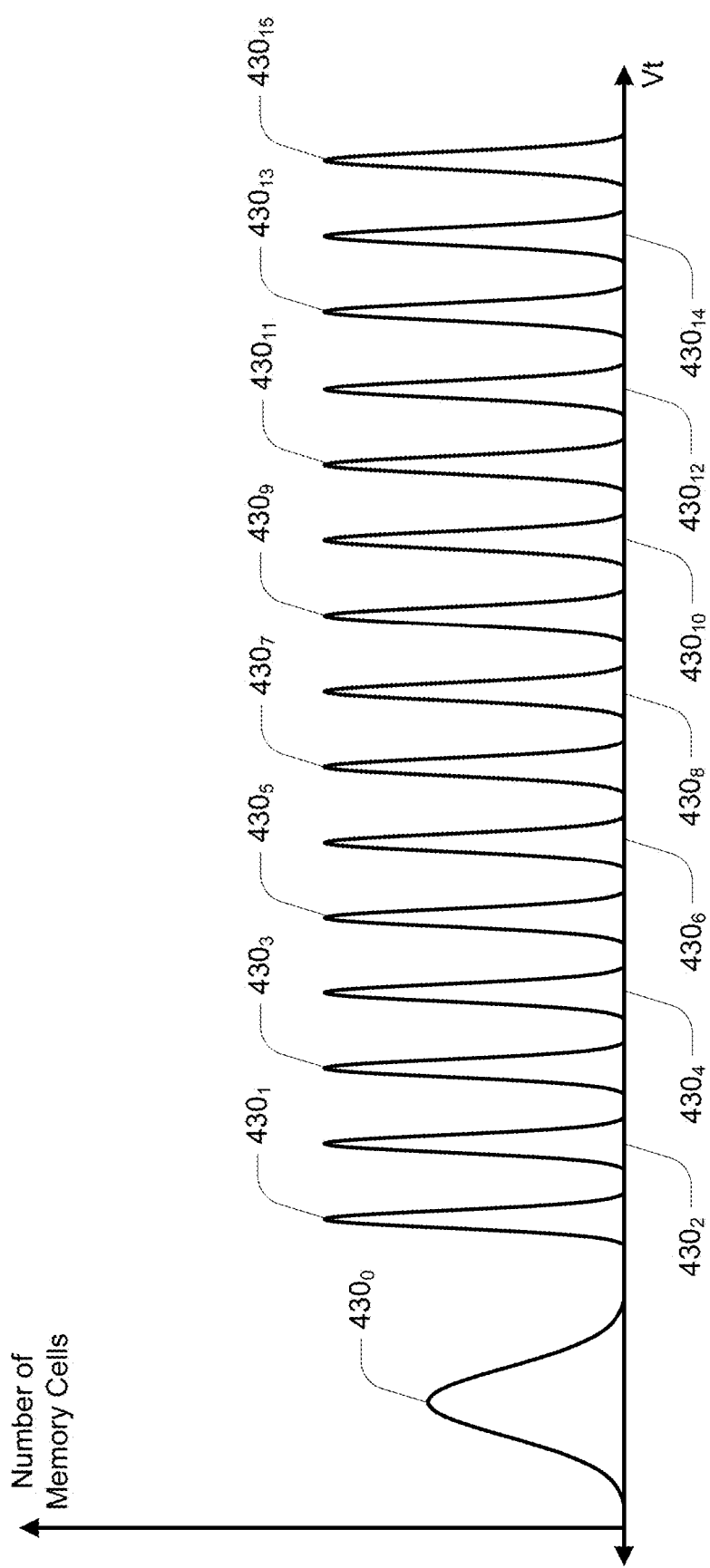
FIG. 4 is a conceptual depiction of threshold voltage distributions of a plurality of memory cells.

FIG. 4 is a conceptual depiction of threshold voltage ranges of a plurality of memory cells. FIG. 4 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ may tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$ and $430_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case may be storing a data state L0 having a data value of logical '1111' and is typically referred to as the erased state of the memory cell. If the threshold voltage is within the second of the sixteen threshold voltage ranges $430_1$, the memory cell in this case may be storing a data state L1 having a data value of logical '0111'. If the threshold voltage is within the third of the sixteen threshold voltage ranges $430_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5:
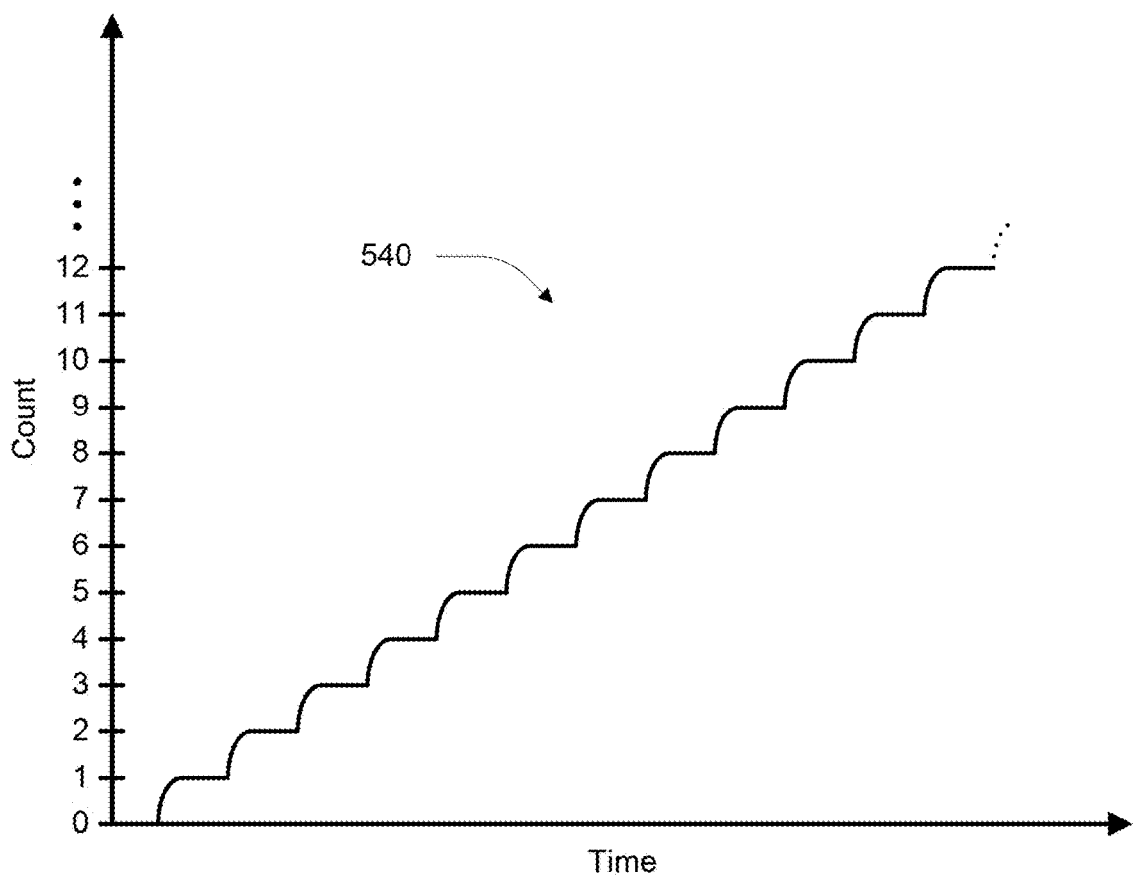
FIG. 5 is a depiction of an increasing voltage level for use with various embodiments.

FIG. 5 is a depiction of an increasing voltage level 540 for use with various embodiments. Various embodiments might use an increasing voltage level applied to access lines (e.g., each access line) during a precharge phase of a read operation, and might use an increasing voltage level applied to a selected access line during a sensing phase of the read operation. The increasing voltage level 540 might be responsive to a count. For example, as values of the counts increase, the voltage level of the increasing voltage level 540 might increase in response. The increasing voltage level 540 may approximate, or more closely approximate, a linear response by increasing the number of counts used to generate a same ranges of voltage levels.

Figure 6:
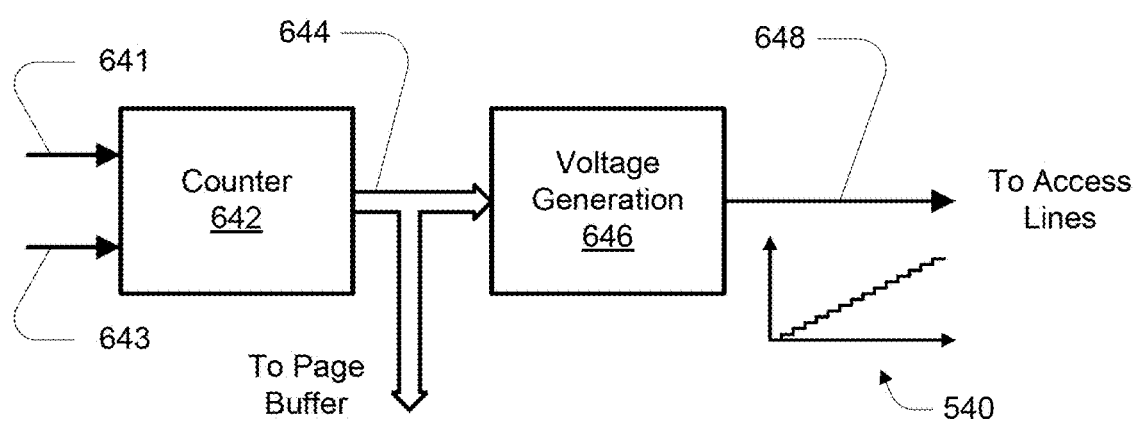
FIG. 6 is a block diagram of a voltage generation system for generating an increasing voltage level of the type depicted in FIG. 5 for use with various embodiments.

FIG. 6 is a block diagram of a voltage generation system for generating an increasing voltage level of the type depicted in FIG. 5 for use with various embodiments. The voltage generation system of FIG. 6 includes a counter 642 for producing a count. As an example, the counter 642 may have an output 644 for providing a bit pattern representative of the count. The counter 642 may be configured to receive an enable signal 641 to selectively enable or disable the counter, e.g., to hold the counter 642 at a last count. The counter 642 may further be configured to receive a reset signal 643 to reset a value of its count to an initial value, e.g., zero.

A voltage generation circuit 646, e.g., a digital-to-analog converter (DAC), might produce an analog voltage level responsive to the output 644 of the counter 642, e.g., responsive to the count. The DAC 646 might provide this voltage level at the output 648. The output 648 of the DAC 646 might be connected (e.g., selectively connected) to access lines (e.g., one or more access lines) of an array of memory cells. For example, the output 648 of the DAC 646 might be selectively connected to word lines 202 of FIGS. 2A-2C. The output 644 of the counter 642 might also be connected (e.g., selectively connected) to a page buffer of a memory, such as a portion of a data register 120 of FIG. 1. Multiple voltage generation systems might be used to provide differing voltage levels to different access lines.

Figure 7:
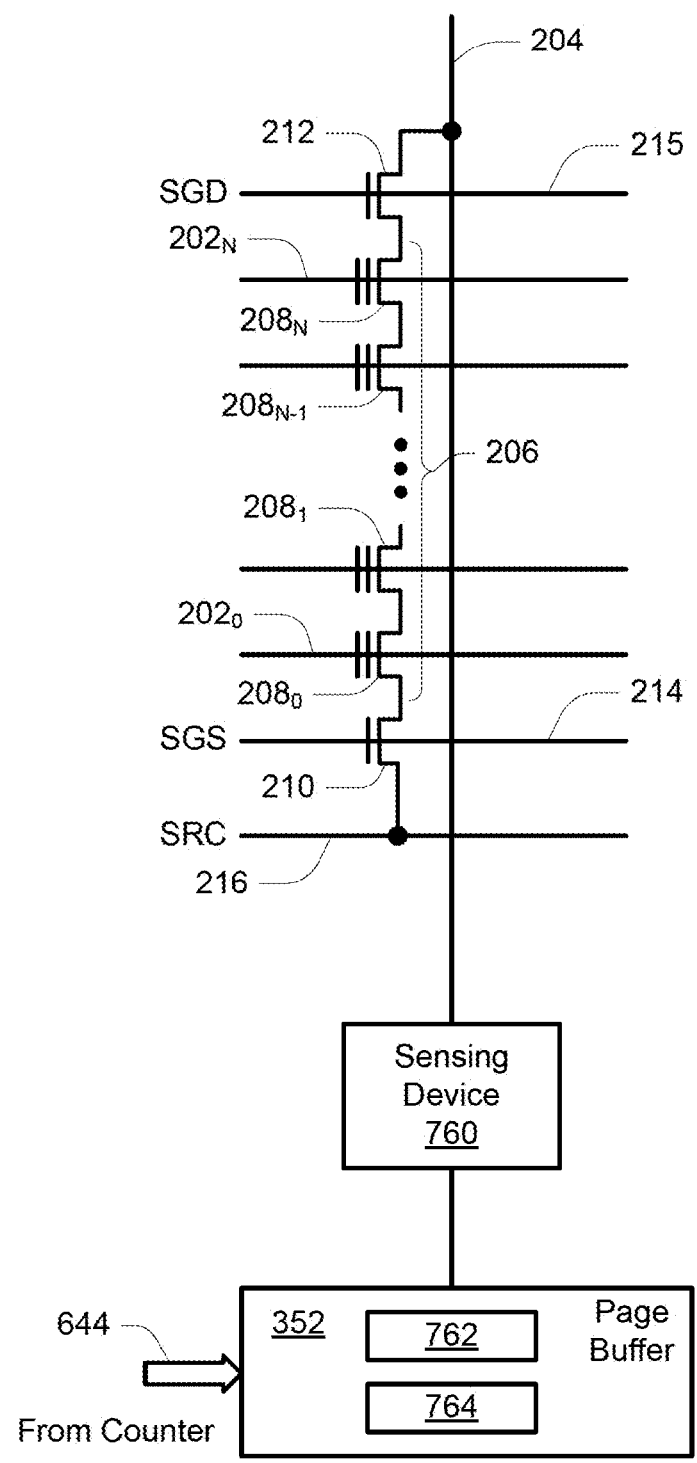
FIG. 7 is a block schematic depicting a connection of a data line to a sensing device and page buffer for use with various embodiments.

FIG. 7 is a block schematic depicting a connection of a data line to a sensing device and page buffer for use with various embodiments. In FIG. 7, a NAND string 206 is selectively connected to a data line 204 through a select gate 212, and to a source 216 through a select gate 210. The NAND string 206 might have the same structure as described with reference to FIG. 2A, having N+1 memory cells $208_0$-$208_N$. In reading the data state of one of the memory cells $208_0$-$208_N$, the select gates 210 and 212 might be activated, a read voltage might be applied to the access line (e.g., selected access line) connected to a memory cell selected for the read operation, e.g., a target memory cell, and a pass voltage might be applied to the access lines (e.g., unselected access lines) connected to each remaining memory cell of the NAND string 206. For example, if the memory cell $208_1$ is selected for the read operation, it might receive the read voltage at its control gate, where that read voltage is configured to activate the memory cell $208_1$ if its data state corresponds to a threshold voltage that is lower than or equal to the read voltage, and to deactivate the memory cell $208_1$ if its data state corresponds to a threshold voltage that is higher than the read voltage. Each remaining memory cell 208 (e.g., memory cells $208_0$ and $208_2$-$208_N$) might receive the pass voltage at their control gates, where that pass voltage is configured to activate each of the remaining memory cells 208 regardless of their data state.

The state of the data line 204 might indicate whether the target memory cell $208_1$ is in a state of activation or deactivation as current flow between the data line 204 and the source 216 might be enabled or inhibited, respectively. This property can then be sensed by a sensing device 760 connected to the data line 204, such as through a measurement of current flow or a resulting voltage level, or a comparison of current flow or resulting voltage level to some threshold value, e.g., using a differential amplifier or the like. The output of the sensing device 760 might be used to set one or more registers of a page buffer 352. For example, a first register 762 might be a one-digit (e.g., one bit) register having a first value (e.g., first logic level) indicative of the target memory cell $208_1$ being deactivated, e.g., in response to a sensing by the sensing device 760 indicating that current flow between the data line 204 and the source 216 is inhibited. The register 762 might further have a second value (e.g., second logic level different than the first logic level) indicative of the target memory cell $208_1$ being activated, e.g., in response to a sensing by the sensing device 760 indicating that current flow between the data line 204 and the source 216 is enabled. The page buffer 352 might further include a second register 764 that might be a multi-digit (e.g., multi-bit) register. In response to a sensing by the sensing device 760 indicating that current flow between the data line 204 and the source 216 is enabled, the page buffer 352 might be configured (e.g., in response to toggling the value of the first register 762 to its second value) to latch a representation of the count from the output 644 of the counter 642 into the register 764. In this manner, the register 764 might contain a representation of the threshold voltage of the target memory cell $208_1$, e.g., a representation of the voltage level at which the state of the data line 204 changed.

As memory cells are reduced in size, their associated data storage structures generally become smaller. In addition, as more levels of data states are stored to memory cells, differentiation between data states may become more difficult. Furthermore, threshold voltages of memory cells may shift due to read disturb and/or other phenomena, such as quick charge loss (QCL). In read disturb, the threshold voltage of a memory cell may shift in response to the voltage applied to the memory cell to facilitate access to the target memory cell selected for reading, e.g., increasing the threshold voltage of the memory cell. QCL is a de-trapping of electrons near a gate dielectric interface out to the channel region of the memory cell, and can cause an immediate Vt shift after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region. Various embodiments provide apparatus and methods that may facilitate a mitigation of these concerns.

Figure 8:
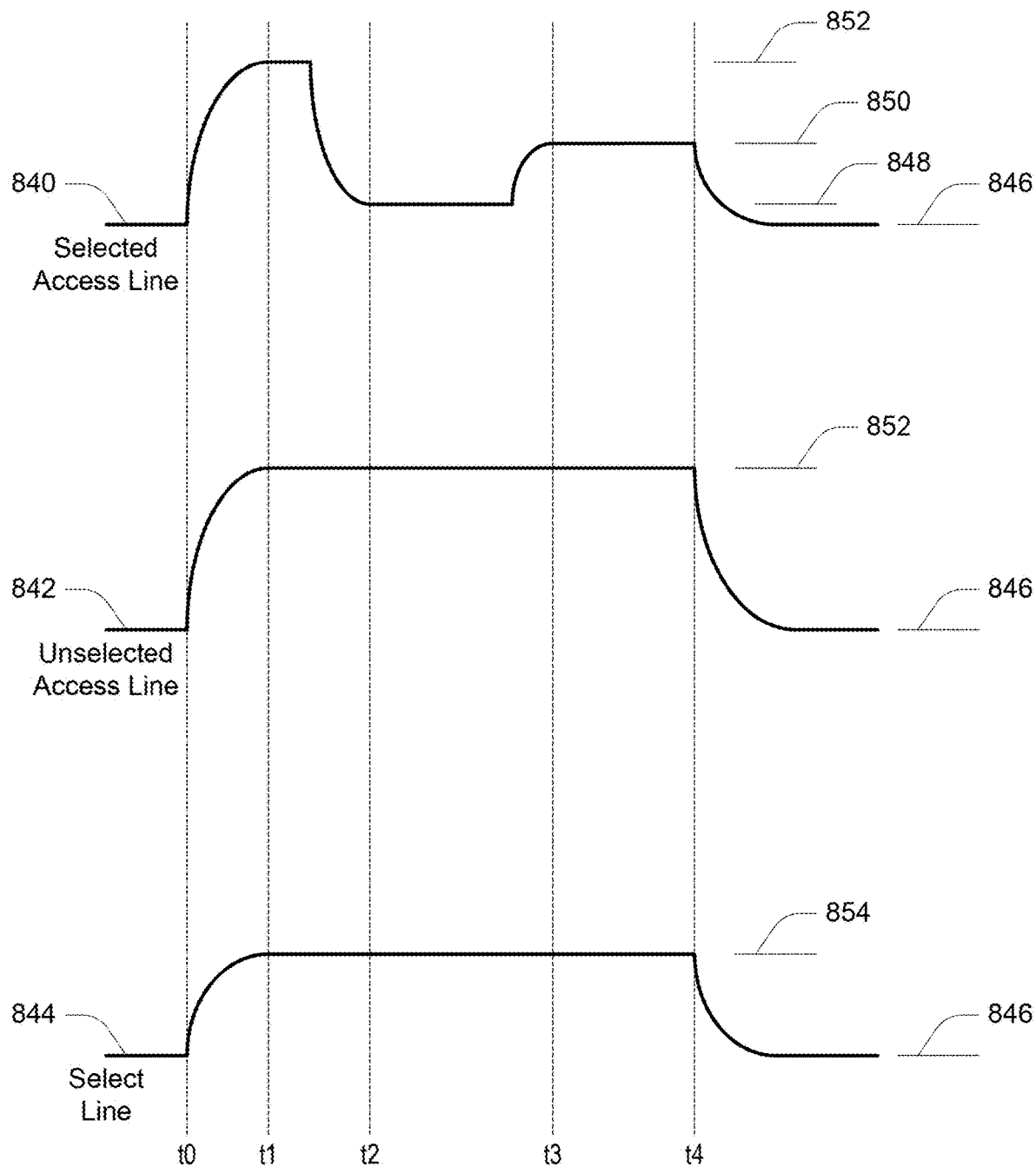
FIG. 8 depicts a timing diagram for a method of operating a memory in accordance with an embodiment.

FIG. 8 depicts a timing diagram for a method of operating a memory in accordance with an embodiment. For example, the timing diagram of FIG. 8 might represent a read operation of a memory. Trace 840 might represent the voltage level applied to an access line connected to a memory cell selected for the read operation, e.g., a target memory cell. The following discussion will be made with reference to at least FIG. 2A and will presume that the memory cell selected for the read operation is the memory cell $208_x$ of the NAND string $206_0$, such that trace 840 might represent the voltage level applied to access line $202_x$. The access line $202_x$ may be referred to as the selected access line as it contains the target memory cell, while remaining access lines 202 may be referred to as unselected access lines. The NAND string $206_0$ may be referred to as the selected string of series-connected memory cells as it contains the target memory cell. Trace 842 might represent the voltage level applied to the unselected access lines 202, e.g., access lines $202_0$-$202_{x-1}$ and $202_{x+1}$-$202_N$. Trace 844 might represent the voltage level applied to the select line 214 and the voltage level applied to the select line 215.

At time t0, a precharge phase might begin. The precharge phase of the read operation brings the unselected access lines 202 to a voltage level sufficient to activate their respective connected memory cells regardless of their data states, e.g., the pass voltage. As shown in the example of FIG. 8, the voltage levels of all access lines 202 of the block of memory cells containing the target memory cell (e.g., one or more target memory cells) are initially brought up to a voltage level 852. The voltage level 852 may be sufficient to activate each memory cell connected to one of the access lines 202 regardless of their data state. As one example, voltage level 852 might be approximately 8V. Bringing all of the access lines 202 up together in this manner may facilitate improvements in speed to steady state of any access line 202 whose desired voltage level is the voltage level 852. The select line 214 and the select line 215 might be brought up to a voltage level 854 sufficient to activate their respective select gates.

As the access lines 202 (e.g., traces 840 and 842) are being increased to the voltage level 852, a preliminary sensing of data lines 204 (e.g., some subset or all of the data lines $204_0$-$204_M$) might be performed in accordance with embodiments and as described in more detail with reference to the following figures. By programming one or more of the NAND strings 206 (e.g., NAND strings $206_0$-$206_M$) to contain predetermined patterns of data, read voltages and a pass voltage for performing the read operation on the block of memory cells containing the target memory cell might be determined.

For the predetermined patterns of data, consider the example of programming memory cells 208 to one of sixteen data states, e.g., data states L0-L15. One or more NAND strings $206_0$-$206_M$ might be programmed such that each of the memory cells 208 of a NAND string 206 has the L0 data state. One or more NAND strings $206_0$-$206_M$ might be programmed such that each of the memory cells 208 of a NAND string 206 has the L1 data state, or at least one of the memory cells 208 of those NAND strings 206 has the L1 data state, and any remaining memory cells 208 of those NAND strings 206 have a data state lower than the L1 data state, e.g., data states corresponding to threshold voltage ranges below the threshold voltage range of the L1 data state. One or more NAND strings $206_0$-$206_M$ might be programmed such that each of the memory cells 208 of a NAND string 206 has the L2 data state, or at least one of the memory cells 208 of those NAND strings 206 has the L2 data state, and any remaining memory cells 208 of those NAND strings 206 have a data state lower than the L2 data state, e.g., data states corresponding to threshold voltage ranges below the threshold voltage range of the L2 data state. This can be repeated such that at least one NAND string 206 is programmed in this manner for each of the possible data states, e.g., all data states to which the memory is configured to program any memory cell of the block of memory cells. NAND strings programmed in this manner might be referred to as canary NAND strings or canary strings of series-connected memory cells as they may provide information regarding any shifting of threshold voltage distributions of memory cells storing user data and/or overhead data.

For some embodiments, a NAND string 206 might be programmed to have one or more of its memory cells 208 programmed to the corresponding data state of that NAND string 206, and any remaining memory cell 208 of that NAND string 206 might have the erased data state, e.g., the L0 data state. For example, blocks of memory cells are often programmed in a particular order of its pages of memory cells. Where less than all of its pages of memory cells are programmed, remaining pages of memory cells might remain in the erased data state. A pattern of data programmed to memory cells 208 of a NAND string 206, where at least one of the memory cells 208 of that NAND string 206 has a particular data state, and any remaining memory cell 208 of that NAND string 206 has a data state lower than or equal to the particular data state, will be referred to as a pattern of data representative of the particular data state.

For some embodiments, a number of NAND strings 206 corresponding to a byte of a page buffer (e.g., eight NAND strings 206) are programmed such that each memory cell 208 of those NAND strings 206 is programmed to have the corresponding data state, e.g., eight NAND strings 206 programmed such that each of their memory cells 208 has the L0 data state, eight NAND strings 206 programmed such that each of their memory cells 208 has the L1 data state, eight NAND strings 206 programmed such that each of their memory cells 208 has the L2 data state, eight NAND strings 206 programmed such that each of their memory cells 208 has the L3 data state, and so on.

In response to the rising voltage level applied to each of the access lines 202 between time t0 and t1, NAND strings 206 might begin to enable current flow between the data line 204 and the source 216. As each NAND string 206 containing one of the predetermined data patterns begin to pass current, determinations can be made regarding a particular voltage level resulting in conduction of the whole NAND string 206 as their respective sensing devices indicate activation of each of its memory cells 208. For a given data state of memory cells 208, the voltage level at which conduction occurs might provide information regarding an expected read voltage to use when sensing for that data state during the read operation. In a similar manner, the voltage level at which conduction occurs for every data line 204 associated with the read operation might provide information regarding an expected pass voltage to use for reading memory cells 208 of the block of memory cells during the read operation.

As an example, the increasing voltage level applied to the access lines 202 (e.g., traces 840 and 842) might be continued until conduction is sensed in every data line 204 associated with the read operation, and the voltage level 852 might be equal to or higher than the voltage level when such conduction is sensed.

At or around time t1, the selected access line $202_x$ might be discharged to a voltage level 848. The voltage level 848 might represent a read voltage intended to distinguish between possible data states of the target memory cell. For example, if the target memory cell is activated while the voltage level 848 is applied to the access line $202_x$, and thus to the control gate of the target memory cell, it may be deemed to have a data state corresponding to a range of threshold voltages lower than or equal to the voltage level 848. If the target memory cell is deactivated while the voltage level 848 is applied to the access line $202_x$, it may be deemed to have a data state corresponding to a range of threshold voltages higher than the voltage level 848. A sensing operation might be performed while the voltage level 848 is being applied, as is well understood in the art. As one example, the voltage level 848 might correspond to a voltage level applied to the access lines 202 at a time when it was determined that one or more NAND strings 206 having memory cells 208 (e.g., each of its memory cells) programmed to a particular data state, e.g., the L0 data state or a lowest data state, were all activated.

While the voltage level 848 is being applied to the selected access line $202_x$ at time t2, the voltage level 852 is being applied to the unselected access lines $202_0$-$202_{x-1}$ and $202_{x+1}$-$202_N$. The voltage level 852 is sufficient to activate the memory cells connected to these unselected access lines regardless of their data state. In addition, while the voltage level 848 is being applied to the selected access line $202_x$ at time t2, the voltage level 854 might be applied to the select line 214 and to the select line 215. The voltage level 854 is sufficient to activate the select gates connected to these select lines. In this manner, current flow may be established through the NAND string 206 if the target memory cell is activated, thus permitting sensing of its data state. As one example, the voltage level 854 might be approximately 5V.

At time t3, the voltage level applied to the selected access line $202_x$ might be increased to the voltage level 850 while voltage levels of the other traces 842 and 844 might be maintained. The voltage level 850 might represent a different read voltage intended to distinguish between different possible data states of the target memory cell. A sensing operation might be performed while the voltage level 850 is being applied, as is well understood in the art. As one example, the voltage level 850 might correspond to a voltage level applied to the access lines 202 at a time when it was determined that one or more NAND strings 206 having memory cells 208 (e.g., each or some subset of its memory cells) programmed to a next higher data state, e.g., the L1 data state, were all activated. While only two read voltages are depicted in FIG. 8, other numbers of read voltages might be used. In general, Y read voltages might be used to distinguish between each of Y+1 possible data states. At time t4, all of the lines might be discharged to the voltage level 846, which might be a reference potential, e.g., ground or 0V. The period between time t2 and t4, for each read voltage of the read operation, might correspond to a sensing phase of the read operation when the data states of one or more target memory cells are sensed.

Figure 9:
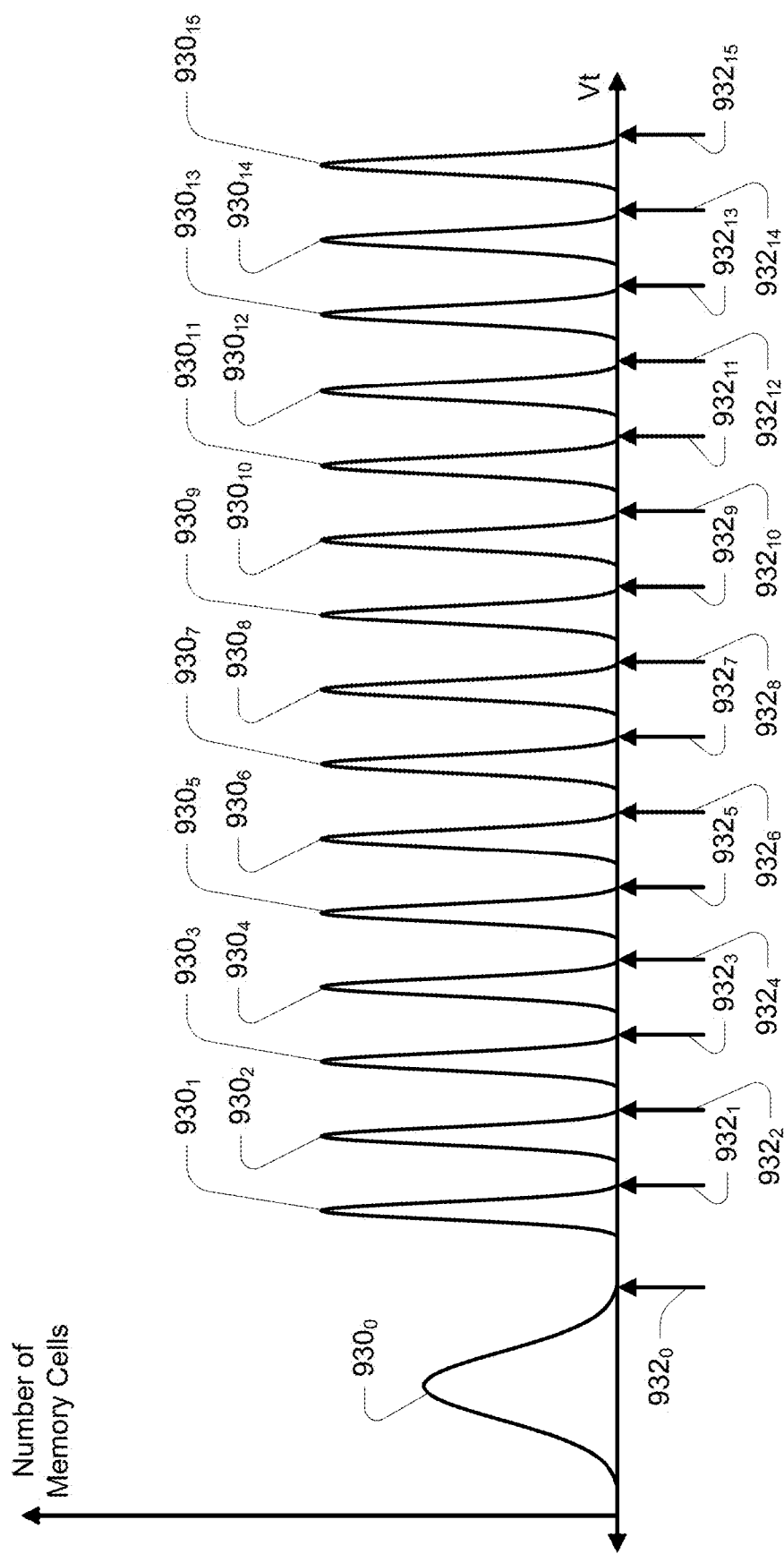
FIG. 9 is a conceptual depiction of threshold voltage distributions of a plurality of memory cells in accordance with an embodiment.

FIG. 9 is a conceptual depiction of threshold voltage distributions of a plurality of memory cells according to an embodiment. FIG. 9 will be used to provide additional detail regarding the process between times t0 and t1 in FIG. 8. Consider the example where at least one canary NAND string 206 is programmed to have memory cells 208 of a respective data state for each of the possible data states. The threshold voltage ranges $930_0$, $930_1$, $930_2$, $930_3$, $930_4$, $930_5$, $930_6$, $930_7$, $930_8$, $930_9$, $930_{10}$, $930_{11}$, $930_{12}$, $930_{13}$, $930_{14}$ and $930_{15}$ might each represent the distribution of threshold voltages of memory cells of one or more NAND strings programmed to a corresponding respective data state, e.g., L0, L1, L2, L3, L4, L5, L6, L7, L8, L9, L10, L11, L12, L13, L14 and L15, respectively.

As the voltage level applied to the access lines 202 (e.g., traces 840 and 842) are increased to the voltage level 852 between time t0 and t1 of FIG. 8, the CANARY NAND strings 206 corresponding to the data state L0 might all be enabled for current flow between the data line 204 and the source 216 when the voltage level reaches the voltage level $932_0$, the CANARY NAND strings 206 corresponding to the data state L1 might all be enabled for current flow between the data line 204 and the source 216 when the voltage level reaches the voltage level $932_1$, the CANARY NAND strings 206 corresponding to the data state L2 might all be enabled for current flow between the data line 204 and the source 216 when the voltage level reaches the voltage level $932_2$, and so on, with each of the data states L0-L15 corresponding to a respective voltage level $932_0$-$932_{15}$. The voltage levels $932_0$-$932_{14}$ might then be used as the read voltages to distinguish between each of the respective data states for completion of the read operation. It is noted that while the voltage level $932_{15}$ might provide useful information, e.g., it could be used in determining the desired pass voltage (e.g., voltage level 852) or in providing an indication of a similarity between the performance of the memory cells of the canary NAND strings and remaining NAND strings, it would generally be unnecessary in determining each of the data states, and might be lower than the voltage level 852.

While having only one canary NAND string 206 having memory cells 208 (e.g., each or some subset of its memory cells 208) programmed to each respective data state may provide sufficient information to determine expected read voltages for those data states, improvements might be facilitated by utilizing more than one canary NAND string 206 for each of the data states.

FIGS. 10A-10B are block schematics of decoding circuitry for use in determining read voltages when more than one canary NAND string 206 is used for a corresponding data state in accordance with embodiments. The decoding circuitry 1000A of FIG. 10A includes a logic circuit, e.g., a NAND gate, $1060_Z$. The logic circuit $1060_Z$ may have a plurality of inputs, each in communication with (e.g., connected to receive) a value of a respective register 762 (e.g., one of the registers $762_{Z0}$-$762_{ZR}$) of a page buffer, e.g., page buffer 352 of FIG. 3. The value of Z might be any integer value from 0 to Y, where Y+1 represents a number of predetermined target data states of the memory cells selectively connected to a register 762 (e.g., any memory cell selectively connected to a data line 204 that is selectively connected to the register 762). There might be a decoding circuitry 1000A for each data state Z from 0 to Y. For example, data state 0 might correspond to data state L0, data state 1 might correspond to data state L1, and so on. The value of R might be any integer value greater than or equal to 1, where R+1 represents a number of NAND strings 206 corresponding to the data state Z, e.g., each having at least one memory cell 208 programmed to the data state Z, and having each remaining memory cell 208 programmed to data states lower than the data state Z. For example, where eight canary NAND strings 206 are used for the data state Z, R might equal seven.

The logic circuit $1060_Z$ might have a first logic level (e.g., a logic high level) when a NAND string 206 and data line 204 corresponding to any of the registers $762_{Z0}$-$762_{ZR}$ remains inhibited from conducting, and might have a second logic level different than the first logic level (e.g., a logic low level) when the NAND strings 206 and data lines 204 corresponding to all of the registers $762_{Z0}$-$762_{ZR}$ are enabled to conduct. A register $1064_Z$ might be in communication with (e.g., connected to receive) a value of the output of the logic circuit $1060_Z$, and in communication with (e.g., connected to receive) a representation of a count from the output 644 of the counter 642. The register $1064_Z$ might be a part of the register bank 128 of FIG. 1. The register $1064_Z$ might further be configured to latch the representation of the count from the output 644 of the counter 642 into the register $1064_Z$ in response to a logic level of the output of the logic circuit $1060_Z$. For example, when the logic circuit $1060_Z$ toggles from its first logic level to its second logic level, the register $1064_Z$ might latch the representation of the count.

The decoding circuitry 1000B of FIG. 10B provides a schematic of one implementation of the logic circuit $1060_Z$. The logic circuit $1060_Z$ of the decoding circuitry 1000B might include a transistor (e.g., a p-type field-effect transistor or pFET) 1068 having a first source/drain (e.g., drain) connected to a first voltage node 1066. The first voltage node 1066 might be configured to receive a supply voltage, e.g., Vcc. The pFET 1068 might further have a second source/drain (e.g., source) in communication with the register $1064_Z$, e.g., connected to the output of the logic circuit $1060_Z$. The logic circuit $1060_Z$ might have its plurality of inputs each connected to a control gate of a respective transistor (e.g., an n-type field-effect transistor or nFET) 1072 (e.g., nFETs $1072_0$-$1072_R$). The nFETs $1072_0$-$1072_R$ might be connected in series between the second source/drain of the pFET 1068 and a second voltage node 1074. The second voltage node 1074 might be configured to receive a reference potential, e.g., ground or 0V.

FIG. 11 is a block schematic of a register bank 128 in accordance with embodiments. The register bank 128 might have a number of registers 1064 (e.g., registers $1064_0$-$1064_Y$). Each register 1064 of the register bank 128 might correspond to a respective data state of the Y+1 predetermined target data states, and may each be configured to latch a representation of a voltage level at which each canary NAND string of its corresponding respective data state indicated current flow. The register $1064_0$ might store an indication of a read voltage that could be used to distinguish between the data states L0 and L1 (or higher), the register $1064_1$ might store an indication of a read voltage that could be used to distinguish between the data states L1 and L2 (or higher), the register $1064_2$ might store an indication of a read voltage that could be used to distinguish between the data states L2 and L3 (or higher), the register $1064_3$ might store an indication of a read voltage that could be used to distinguish between the data states L3 and L4 (or higher), and so on. For some embodiments, the register $1064_Y$ might be eliminated.

The register bank 128 might further include a register 1066. The register 1066 might be configured to latch a representation of a voltage level at which each NAND string of the read operation indicated current flow, e.g., each NAND string connected to a data line that is connected to a sensing device participating in the read operation. Decoding when each NAND string of a read operation indicates current flow might be performed in a manner similar to that described with regard to the canary NAND strings. For example, a logic circuit (e.g., such as a logic circuit 1060) might be configured to have a plurality of inputs, each in communication with (e.g., connected to receive) a value of a respective register 762 participating in the read operation, e.g., registers 762 corresponding to canary NAND strings 206 and registers 762 corresponding to NAND strings 206 containing a target memory cell for the read operation. Alternatively, the logic circuit might have inputs for less than all of the registers 762 participating in the read operation, e.g., it may have inputs only for those registers 762 corresponding to NAND strings 206 containing a target memory cell for the read operation. The logic circuit might have a first logic level (e.g., a logic high level) when a NAND string 206 and data line 204 corresponding to any of its input registers 762 remains inhibited from conducting, and might have a second logic level different than the first logic level (e.g., a logic low level) when the NAND strings 206 and data lines 204 corresponding to all of its input registers 762 are enabled to conduct. The register 1066 might be in communication with (e.g., connected to receive) a value of the output of the logic circuit, and in communication with (e.g., connected to receive) a representation of a count from the output 644 of the counter 642. The register 1066 might further be configured to latch the representation of the count from the output 644 of the counter 642 into the register 1066 in response to a logic level of the output of its logic circuit. The register 1066 might store an indication of a pass voltage that could be used to activate each memory cell regardless of their data states.

FIG. 12 is a block diagram of data lines of an array of memory cells in accordance with an embodiment. Various embodiments might store predetermined patterns of data to memory cells associated with a portion of the data lines connected to the page buffer. The predetermined patterns of data might represent each of the data states assignable to the memory cells. These memory cells might be expected to experience the same or similar levels of threshold voltage shift as the memory cells associated with the remaining portion of the data lines connected to the page buffer. For one embodiment, the array of memory cells might include a first portion $1290_0$ of data lines selectively connected to memory cells configured to store the predetermined patterns of data, which can be referred to as canary data lines, e.g., canary bit lines, $1204_0$-$1204_C$. The array of memory cells might further include a second portion $1290_1$ of data lines selectively connected to memory cells configured to store user data and/or overhead data (e.g., ECC data and/or metadata), which can be referred to as primary data lines, e.g., primary bit lines, $2204_0$-$2204_P$.

As one example, the first portion $1290_0$ of data lines might include 256 canary data lines 1204, e.g., where C equals 255. For embodiments connecting every other data line to a sensing device during a read operation, 128 canary data lines 1204 might be sensed while increasing the voltage level applied the access lines, e.g., during a precharge phase of a read operation. For embodiments connecting every data line to a sensing device during a read operation, C might equal 127 to utilize 128 canary data lines 1204 during the read operation. For the example of sixteen possible data states, eight of these canary data lines 1204 might be selectively connected to NAND strings storing patterns of data representative of the L0 data state in their corresponding memory cells for one or more blocks of memory cells of a memory plane, eight might be selectively connected to NAND strings storing patterns of data representative of the L1 data state in their corresponding memory cells for one or more blocks of memory cells of a memory plane, and so on. The use of canary data lines 1204 in this manner might aid determination of appropriate read voltages and a pass voltage to utilize in the determination of the data states of the memory cells of a logical page of memory cells selected for a read operation.

While FIG. 12 depicts the canary data lines 1204 and the primary data lines 2204 for user data and/or overhead data to be in respective contiguous groupings, other arrangements might be used. For example, the canary data lines 1204 might be interleaved with primary data lines 2204. Similarly, multiple canary data lines 1204 corresponding to one data state might be in a contiguous grouping, or they might be interleaved among canary data lines 1204 corresponding to other data states. The predetermined patterns of data of the canary data lines 1204 might be programmed to its corresponding memory cells for each block of memory cells of its memory plane.

Figure 13:
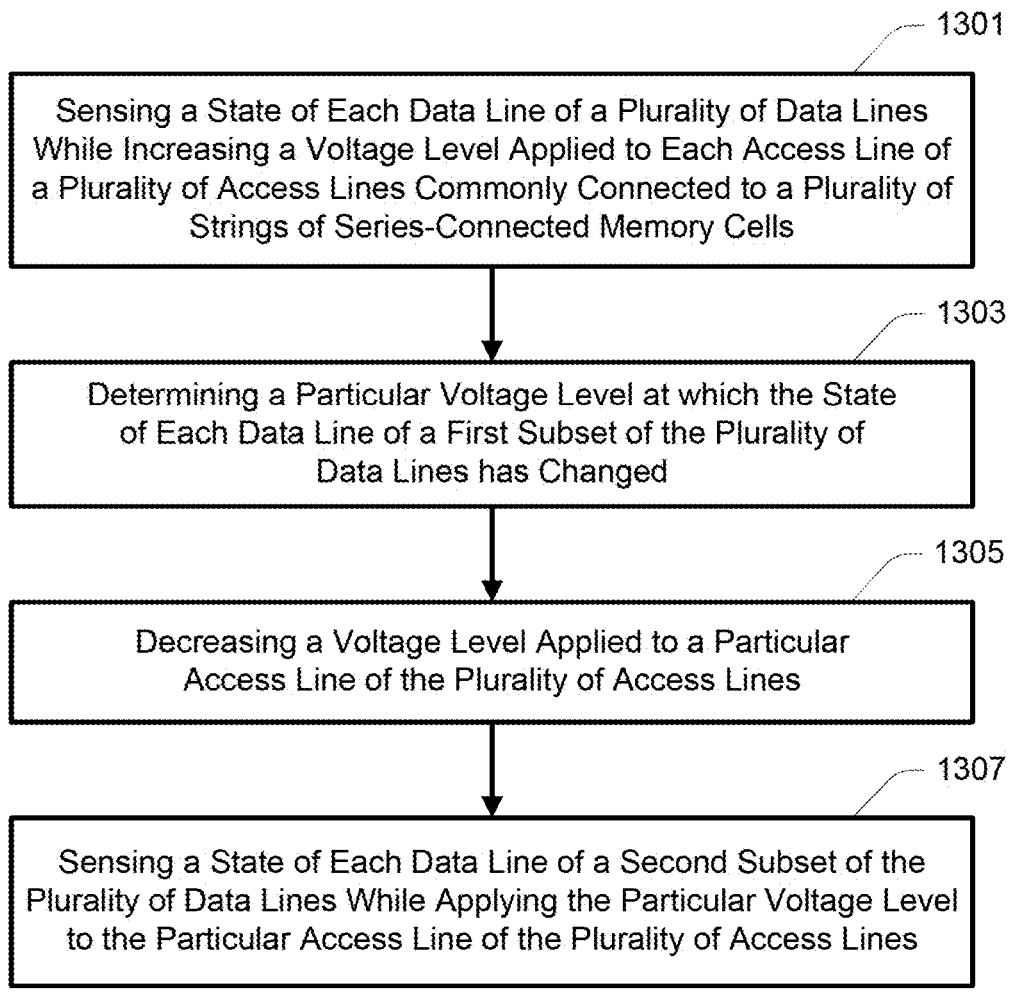
FIG. 13 is a flowchart of a method of operating a memory in accordance with an embodiment.

FIG. 13 is a flowchart of a method of operating a memory in accordance with an embodiment. For example, the method of FIG. 13 might be a portion of a read operation.

At 1301, a state of each data line of a plurality of data lines is sensed while increasing a voltage level applied to each access line of a plurality of access lines commonly connected to a plurality of strings of series-connected memory cells. This may include increasing the voltage level applied to all access lines commonly connected to the plurality of strings of series-connected memory cells, e.g., such that the control gate of every memory cell of these strings of series-connected memory cells are receiving the increasing voltage level. For example, an increasing voltage level such as described with reference to FIGS. 5-6 might be applied to each of the access lines.

The plurality of data lines might be each data line selectively connected to a block of memory cells (or a plurality of blocks of memory cells) of a memory plane. Alternatively, the plurality of data lines might be less than all data lines selectively connected to the block of memory cells. For example, where a read operation only seeks to sense data states of memory cells connected to every other data line selectively connected to a block of memory cells, the plurality of data lines might be every other (e.g., even or odd) data line selectively connected to that block of memory cells. Likewise, the plurality of strings of series-connected memory cells might be each string of series-connected memory cells of the selected block of memory cells, or less than all strings of series-connected memory cells of the selected block of memory cells, e.g., every other (e.g., even or odd) string of series-connected memory cells of the selected block of memory cells.

Each string of series-connected memory cells of the plurality of strings of series-connected memory cells might correspond to a respective data line of the plurality of data lines, e.g., in a one-to-one relationship. While sensing the state of each data line of the plurality of data lines, select gates (e.g., drain select gates and/or source select gates) corresponding to each string of series-connected memory cells of the plurality of strings of series-connected memory cells might be activated.

At 1303, a particular voltage level is determined at which the state of each data line of a first subset of the plurality of data lines has changed. For example, an initial state of a data line might be floating, e.g., isolated from a source by a deactivated memory cell of its corresponding string of series-connected memory cells, and it might be precharged to a particular voltage level, e.g., Vcc. As the increasing voltage level applied to the plurality of access lines reaches a voltage level sufficient to activate each memory cell of that corresponding string of series-connected memory cells, the state of that data line might change to conducting, e.g., connected to the source through its corresponding string of series-connected memory cells. The first subset of the plurality of data lines might contain one or more data lines of the plurality of data lines.

At 1305, the voltage level applied to a particular access line of the plurality of access lines is decreased, e.g., after determining the particular voltage level. For some embodiments, decreasing the voltage level applied to the particular access line might occur after determining a voltage level at which the state of each data line of the plurality of data lines has changed. This might occur when each memory cell of each string of series-connected memory cells of the plurality of strings of series-connected memory cells is activated.

For other embodiments, decreasing the voltage level applied to the particular access line might further occur after determining a voltage level at which the state of each data line of a different subset of the plurality of data lines containing the first subset of the plurality of data lines has changed. For example, the first subset of the plurality of data lines might correspond to strings of series-connected memory cells each programmed to contain a pattern of data representative of a particular data state of a plurality of data states (e.g., a plurality of predetermined target data states). In this example, the different subset of the plurality of data lines might further include data lines of the plurality of data lines corresponding to strings of series-connected memory cells each programmed to contain a pattern of data representative of other (e.g., higher) data states of the plurality of data states.

The particular access line might be an access line selected for a read operation, e.g., connected to a control gate of a target memory cell whose data state is to be sensed during the read operation. For some embodiments, the voltage level applied to the particular access line might be decreased to the particular voltage level. For other embodiments, the voltage level applied to the particular access line might be decreased to a voltage level lower than the particular voltage level. The voltage level applied to the particular access line might be decreased without decreasing (e.g., while maintaining or increasing) the voltage level applied to each remaining access line of the plurality of access lines.

At 1307, a state of each data line of a second subset of the plurality of data lines is sensed while applying the particular voltage level to the particular access line. Sensing the state of each data line of the second subset of the plurality of data lines might include determining whether each data line of the second subset of the plurality of data lines is connected to, or isolated from, the source through its corresponding string of series-connected memory cells, e.g., depending upon a state of the memory cell of its corresponding string of series-connected memory cells connected to the particular access line responsive to the particular voltage level being applied to its control gate.

Sensing the state of each data line of the second subset of the plurality of data lines might occur without decreasing (e.g., while maintaining or increasing) the voltage level applied to each access line of the plurality of access lines other than the particular access line. Similarly, while sensing the state of each data line of the second subset of the plurality of data lines, select gates (e.g., drain select gates and/or source select gates) corresponding to each string of series-connected memory cells corresponding to the second subset of the plurality of data lines might be activated. The second subset of the plurality of data lines may be mutually exclusive of the first subset of the plurality of data lines. The second subset of the plurality of data lines may contain one or more data lines of the plurality of data lines other than the first subset of the plurality of data lines. Alternatively, the second subset of the plurality of data lines may contain each data line of the plurality of data lines other than the first subset of the plurality of data lines.

Alternatively, the second subset of the plurality of data lines may contain each data line of the plurality of data lines other than a subset of the plurality of data lines including data lines of the plurality of data lines corresponding to strings of series-connected memory cells each programmed to contain a pattern of data representative of a respective data state of the plurality of data states, and representing each data state of the plurality of data states.

Figure 14:
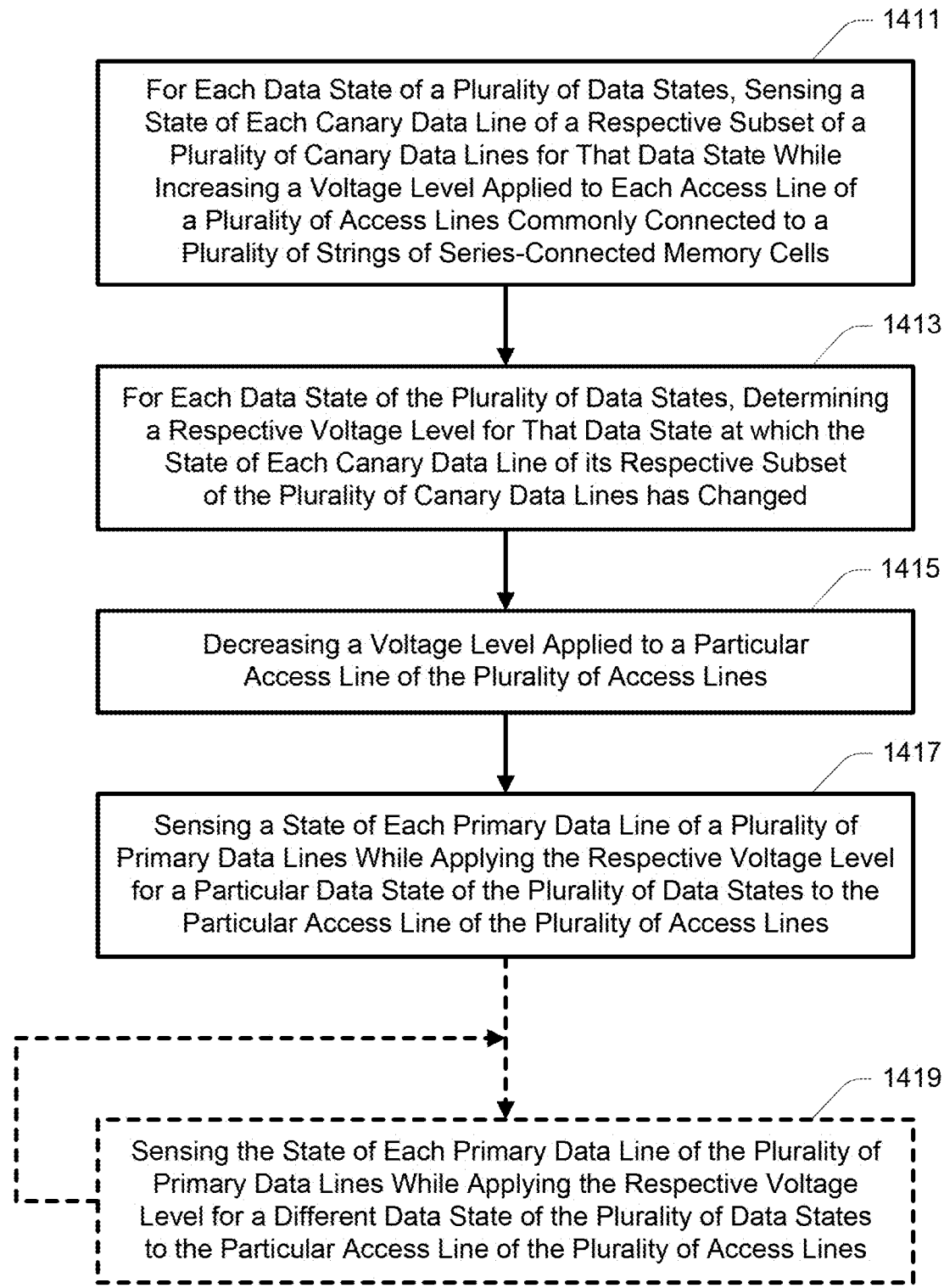
FIG. 14 is a flowchart of a method of operating a memory in accordance with another embodiment.

FIG. 14 is a flowchart of a method of operating a memory in accordance with another embodiment. For example, the method of FIG. 14 might be a portion of a read operation.

At 1411, for each data state of a plurality of data states, a state of each canary data line of a respective subset of a plurality of canary data lines for that data state is sensed while increasing a voltage level applied to each access line of a plurality of access lines commonly connected to a plurality of strings of series-connected memory cells. This may include increasing the voltage level applied to all access lines commonly connected to the plurality of strings of series-connected memory cells, e.g., such that the control gate of every memory cell of these strings of series-connected memory cells is receiving the increasing voltage level. A first subset of the plurality of strings of series-connected memory cells might be selectively connected to the plurality of canary data lines.

Each respective subset of the plurality of canary data lines might contain one or more canary data lines of the plurality of canary data lines. Each respective subset of the plurality of canary data lines might contain the same or a different number of canary data lines than other respective subsets of the plurality of canary data lines. Each respective subset of the plurality of canary data lines might correspond to strings of series-connected memory cells each programmed to contain a pattern of data representative of its respective data state of the plurality of data states (e.g., a plurality of predetermined target data states). The plurality of data states might include each data state to which the memory is configured to program any memory cell of the plurality of strings of series-connected memory cells. For example, if the memory is configured to program a memory cell to one of sixteen different data states (e.g., L0-L15), or if the memory is configured to read a memory cell to distinguish the sixteen different data states, the plurality of data states might include all sixteen data states. Alternatively, the plurality of data states might include less than all of the sixteen data states, e.g., the plurality of data states at 1411 might exclude a highest data state (e.g., L15) of the plurality of data states.

The plurality of canary data lines might be selectively connected to a portion of a block of memory cells (or a plurality of blocks of memory cells) of a memory plane. The plurality of canary data lines might form a contiguous grouping of canary data lines. Furthermore, the respective subset of the plurality of canary data lines for a particular data state of the plurality of data states might be a contiguous grouping of canary data lines, or it might be interleaved with other data lines, e.g., other canary data lines of one or more different subsets of the plurality of canary data lines, data lines selectively connected to strings of series-connected memory cells of the plurality of strings of series-connected memory cells that are not being sensed during the read operation, or other data lines being sensed during the read operation other than the plurality of canary data lines.

Each string of series-connected memory cells of the first subset of the plurality of strings of series-connected memory cells might correspond to a respective canary data line of the plurality of canary data lines, e.g., in a one-to-one relationship. While sensing the state of each canary data line of the plurality of canary data lines, select gates (e.g., drain select gates and/or source select gates) corresponding to each string of series-connected memory cells of the first subset of the plurality of strings of series-connected memory cells might be activated.

At 1413, for each data state of the plurality of data states, a respective voltage level is determined for that data state at which the state of each canary data line of its respective subset of the plurality of canary data lines has changed. For example, an initial state of a data line (e.g., canary or other) might be floating, e.g., isolated from a source by a deactivated memory cell of its corresponding string of series-connected memory cells. As the increasing voltage level applied to the plurality of access lines reaches a voltage level sufficient to activate each memory cell of that corresponding string of series-connected memory cells, the state of that data line might change to conducting, e.g., connected to the source through its corresponding string of series-connected memory cells.

At 1415, the voltage level applied to a particular access line of the plurality of access lines is decreased, e.g., after determining each of the respective voltage levels at 1413. For some embodiments, decreasing the voltage level applied to the particular access line might occur after determining a voltage level at which the state of each canary data line of the plurality of canary data lines and each primary data line of a plurality of primary data lines has changed. This might occur when each memory cell of each string of series-connected memory cells of the plurality of strings of series-connected memory cells is activated, and might indicate a value for a pass voltage for the read operation.

The particular access line might be an access line selected for a read operation, e.g., connected to control gates of one or more target memory cells whose data states are to be sensed during the read operation. For some embodiments, the voltage level applied to the particular access line might be decreased to the respective voltage level for a lowest data state of the plurality of data states. For other embodiments, the voltage level applied to the particular access line might be decreased to a voltage level lower than the respective voltage level for the lowest data state of the plurality of data states. The voltage level applied to the particular access line might be decreased without decreasing (e.g., while maintaining or increasing) the voltage level applied to each remaining access line of the plurality of access lines.

At 1417, a state of each primary data line of a plurality of primary data lines is sensed while applying the respective voltage level for a particular data state of the plurality of data states to the particular access line. Sensing the state of each primary data line of the plurality of primary data lines might include determining whether each primary data line of the plurality of primary data lines is connected to, or isolated from, the source through its corresponding string of series-connected memory cells, e.g., depending upon a state of the memory cell of its corresponding string of series-connected memory cells connected to the particular access line responsive to the respective voltage level being applied to its control gate.

Sensing the state of each primary data line of the plurality of primary data lines might occur without decreasing (e.g., while maintaining or increasing) the voltage level applied to each access line of the plurality of access lines other than the particular access line. Similarly, while sensing the state of each primary data line of the plurality of primary data lines, select gates (e.g., drain select gates and/or source select gates) corresponding to each string of series-connected memory cells corresponding to the plurality of primary data lines might be activated. The plurality of primary data lines may be mutually exclusive of the plurality of canary data lines. The plurality of primary data lines may contain each data line being sensed during the read operation other than the plurality of canary data lines. It is noted that while sensing the state of each primary data line of the plurality of primary data lines, the state of each canary data line of the plurality of canary data lines might be sensed. However, the state of a canary data line at 1417 might be irrelevant.

Sensing the state of each primary data line of the plurality of primary data lines while applying the respective voltage level for the particular data state to the particular access line might indicate a data state of one or more of the memory cells connected to the particular access line. For example, where the state of a primary data line indicates activation of its corresponding memory cell, the data state of that memory cell might be indicated as being of a threshold voltage range lower than or equal to that respective voltage level. Similarly, where the state of a primary data line indicates deactivation of its corresponding memory cell, the data state of that memory cell might be indicated as being of a threshold voltage range higher than that respective voltage level. Where the state of a primary data line indicates activation of its corresponding memory cell while applying the respective voltage level for a particular data state (e.g., L1) to the particular access line, and indicated deactivation of its corresponding memory cell while applying the respective voltage level for a next lower data state (e.g., L0) to the particular access line, the data state of that memory cell might be indicated as being the particular data state.

At 1419, the state of each primary data line of the plurality of primary data lines is sensed while applying the respective voltage level for a different data state of the plurality of data states to the particular access line. The process of 1419 might be repeated for each remaining data state of the plurality of data states. This repeating process might begin with the respective voltage level for a lowest data state of the plurality of data states at 1417, and continue with each successively higher data state of the plurality of data states. For a memory cell connected to the particular access lines that does not activate in response to any respective voltage level for each data state of the plurality of data states, that memory cell might be deemed to have a data state higher than any data state of the plurality of data states. For example, in a memory configured to program the memory cells of the plurality of strings of series-connected memory cells to sixteen data states L0-L15, and where the plurality of data states includes the data states L0-L14, a memory cell that does not activate in response to any respective voltage level for each data state of the plurality of data states might be deemed to have the L15 data state.

It is noted that the method of FIG. 14 might be repeated for a subsequent read operation, e.g., using a different access line of the plurality of access lines as the particular access line, but without determining the respective voltage levels for the data states of the plurality of data states. For example, for a first read operation performed on a block of memory cells, the determined respective voltage levels for the various data states might be deemed to be the same for a subsequent (e.g., immediately subsequent) read operation on that same block of memory cells, such that there might be no need to re-determine those values. For embodiments where a voltage level of the pass voltage is also determined, this might also be deemed to be the same for the subsequent read operation. While the subsequent read operation might increase the voltage level applied to each access line of the plurality of access lines at 1411 and decrease the voltage level applied to a particular access line at 1415, there might be no need to determine the respective voltage levels applied in 1417-1419 as the same canary data lines might be involved.

Figure 15:
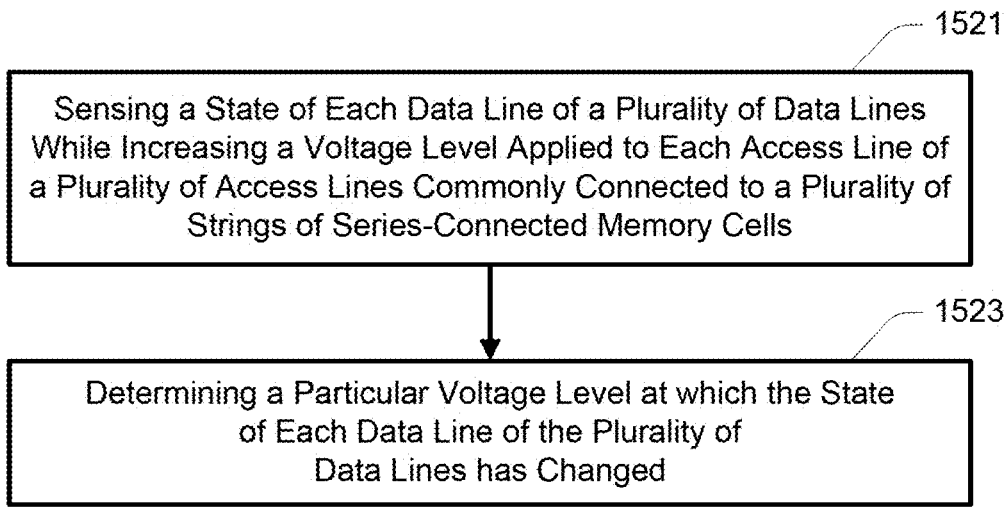
FIG. 15 is a flowchart of a method of operating a memory in accordance with a further embodiment.

FIG. 15 is a flowchart of a method of operating a memory in accordance with a further embodiment. For example, the method of FIG. 15 might be a portion of a read operation. The method of FIG. 15 might be performed in conjunction with the methods of FIG. 13 or 14, e.g., concurrently performed. As used herein, a first act and a second act occur concurrently when the first act occurs simultaneously with the second act for at least a portion of a duration of the second act. For example, increasing the voltage level applied to each access line of the plurality of access lines at 1521 of FIG. 15 might occur simultaneously with increasing the voltage level applied to each access line of the plurality of access lines at 1301 of FIG. 13, or at 1411 of FIG. 14, for at least a portion of the duration of increasing the voltage level applied to each access line of the plurality of access lines at 1521 of FIG. 15.

At 1521, a state of each data line of a plurality of data lines is sensed while increasing a voltage level applied to each access line of a plurality of access lines commonly connected to a plurality of strings of series-connected memory cells. This may include increasing the voltage level applied to all access lines commonly connected to the plurality of strings of series-connected memory cells, e.g., such that the control gate of every memory cell of these strings of series-connected memory cells are receiving the increasing voltage level.

The plurality of data lines at 1521 might be a same plurality of data lines that might be used with the method of FIG. 13. Alternatively, the plurality of data lines at 1521 might include the plurality of canary data lines and the plurality of primary data lines as used with the method of FIG. 14. Each string of series-connected memory cells of the plurality of strings of series-connected memory cells might correspond to a respective data line of the plurality of data lines, e.g., in a one-to-one relationship. While sensing the state of each data line of the plurality of data lines, select gates (e.g., drain select gates and/or source select gates) corresponding to each string of series-connected memory cells of the plurality of strings of series-connected memory cells might be activated.

At 1523, a particular voltage level is determined at which the state of each data line of the plurality of data lines has changed. For example, an initial state of a data line might be floating, e.g., isolated from a source by a deactivated memory cell of its corresponding string of series-connected memory cells. As the increasing voltage level applied to the plurality of access lines reaches a voltage level sufficient to activate each memory cell of that corresponding string of series-connected memory cells, the state of that data line might change to conducting, e.g., connected to the source through its corresponding string of series-connected memory cells. This particular voltage might indicate a pass voltage for the read operation sufficient to activate each memory cell of the plurality of strings of series-connected memory cells regardless of their data state.

Figure 16:
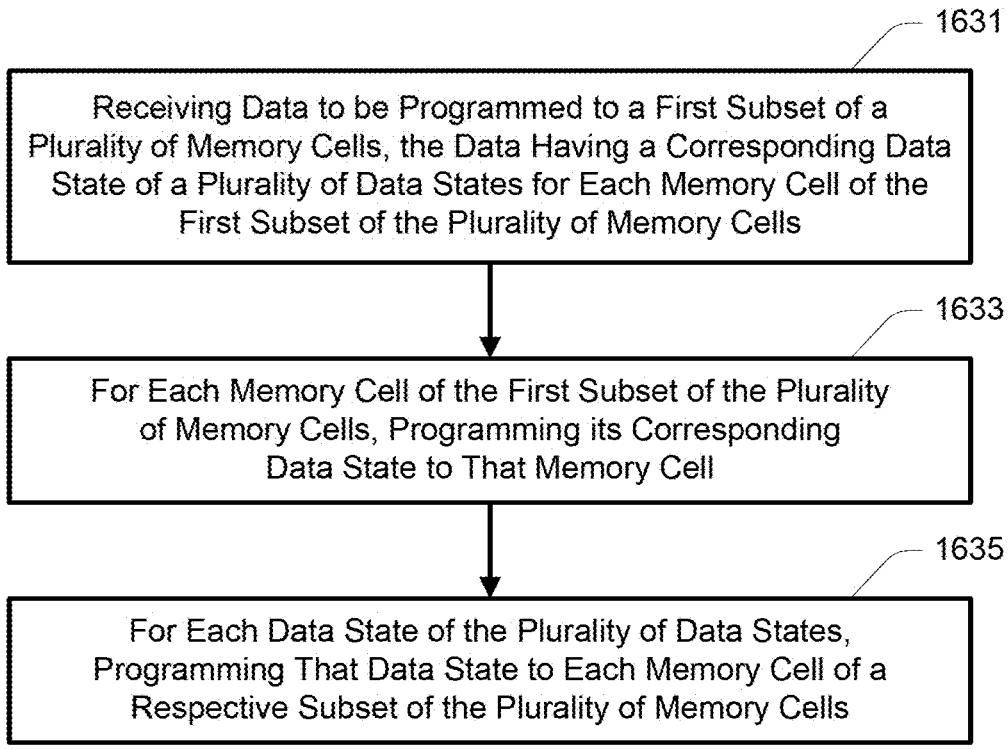
FIG. 16 is a flowchart of a method of operating a memory in accordance with a still further embodiment.

FIG. 16 is a flowchart of a method of operating a memory in accordance with a still further embodiment. For example, the method of FIG. 16 might be a portion of a programming operation (e.g., write operation). The method of FIG. 16 might be performed as a precursor to performing the methods of FIGS. 13-15.

At 1631, data to be programmed to a first subset of a plurality of memory cells is received. The data has a corresponding data state of a plurality of data states (e.g., a plurality of predetermined target data states) for each memory cell of the first subset of the plurality of memory cells. The data might be received by a memory, e.g., memory 100, from a controller external to the memory, e.g., the processor 130. The plurality of memory cells might be a logical page of a block of memory cells. Alternatively, the plurality of memory cells might be a block of memory cells. The data might be associated with one or more write commands received by the memory.

At 1633, for each memory cell of the first subset of the plurality of memory cells, its corresponding data state is programming to that memory cell. The programming of the corresponding data states for the memory cells of the first subset of the plurality of memory cells might be performed concurrently.

At 1635, for each data state of the plurality of data states, that data state is programmed to each memory cell of a respective subset of the plurality of memory cells, without reference to any of the received data. The respective subset of the plurality of memory cells for any data state of the plurality of data states might contain one or more memory cells. The respective subset of the plurality of memory cells for any data state of the plurality of data states might be mutually exclusive from the respective subset of the plurality of memory cells for any other data state of the plurality of data states, and might be mutually exclusive from the first subset of the plurality of memory cells. Programming in this manner might be used to program the respective patterns of data representative of a respective data state of the plurality of data states along with user data.

Figure 17:
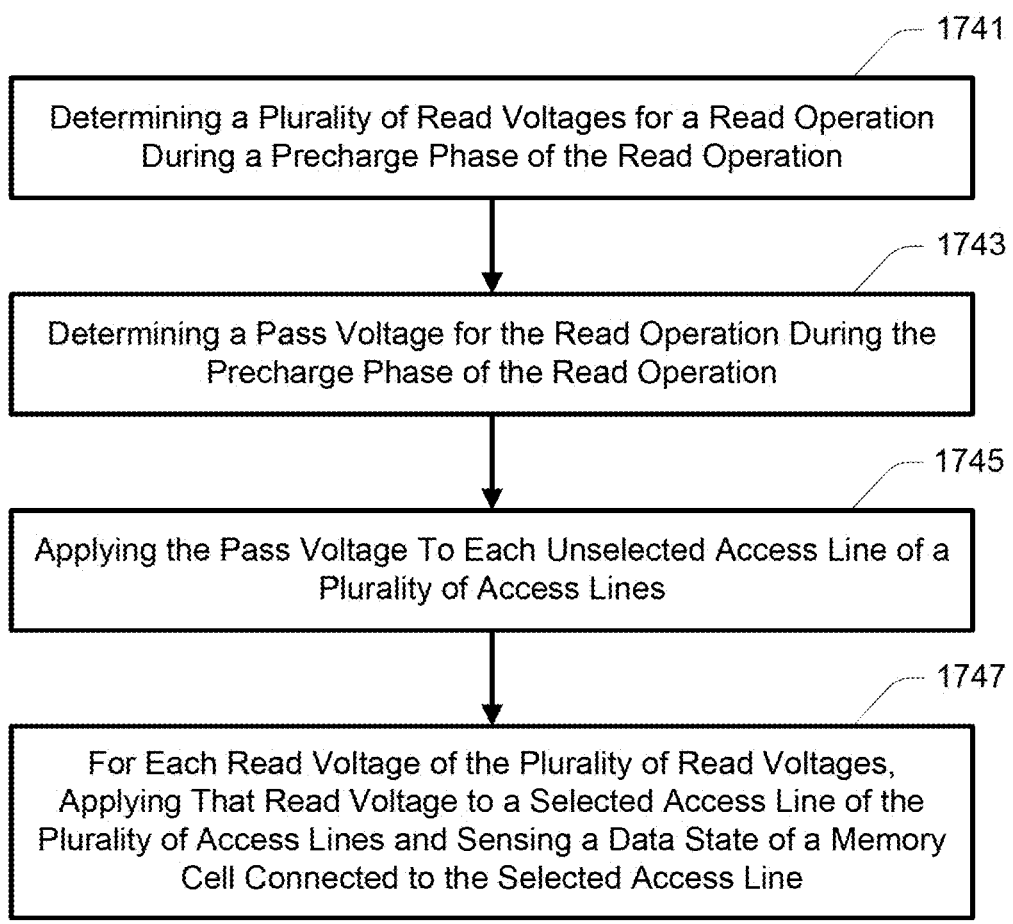
FIG. 17 is a flowchart of a method of operating a memory in accordance with a still further embodiment.

FIG. 17 is a flowchart of a method of operating a memory in accordance with a still further embodiment. For example, the method of FIG. 17 might be a portion of a read operation.

At 1741, a plurality of read voltages are determined for a read operation during a precharge phase of the read operation. The plurality of read voltages might correspond to each data state to which the memory was configured to program any memory cell that is to be sensed during the read operation. For example, if the memory was configured to program a memory cell to one of sixteen different data states (e.g., L0-L15), the plurality of read voltages might include sixteen read voltages. Alternatively, the plurality of read voltages might correspond to fewer than all of the sixteen data states, e.g., the plurality of read voltages at 1741 might not include a read voltage corresponding to a highest data state (e.g., L15) to which the memory was configured to program one of the memory cells. The precharge phase of the read operation might include increasing a voltage level applied to access lines involved in the read operation, and sensing for when the memory cells of various strings of series-connected memory cells programmed to contain patterns of data representative of respective data states are activated as previously described.

At 1743, a pass voltage for the read operation is determined during the precharge phase of the read operation. The pass voltage might be a voltage level at which all memory cells involved in the read operation are activated as previously described. The pass voltage might be determined concurrently with, and subsequently to, determining the read voltages.

At 1745, the pass voltage is applied to each unselected access line of a plurality of access lines. At 1747, for each read voltage of the plurality of read voltages, a data state of a memory cell (e.g., a target memory cell) of a plurality of memory cells selected for the read operation is sensed while applying that read voltage to a selected access line of the plurality of access lines. The plurality of read voltages might be applied in increasing order, e.g., from a lowest read voltage of the plurality of read voltages to a highest read voltage of the plurality of read voltages. The sensed data state for a memory cell might be indicated as being a data state corresponding to the voltage level of the particular read voltage at which that memory cell activated. For a memory cell selected for the read operation that does not activate in response to any read voltage of the plurality of read voltages, that memory cell might be deemed to have a data state higher than any data state corresponding to a read voltage of the plurality of read voltages.

It is noted that the process of 1745 and 1747 might be repeated for a subsequent read operation, e.g., using a different selected access line. For example, for a first read operation performed on a block of memory cells, the determined pass voltage and the determined plurality of read voltages might be deemed to be the same for a subsequent (e.g., immediately subsequent) read operation on that same block of memory cells, such that there might be no need to re-determine those values.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
sensing a state of each data line of a plurality of data lines while increasing a voltage level applied to each access line of a plurality of access lines commonly connected to a plurality of strings of series-connected memory cells;
determining a particular voltage level at which the state of each data line of a first subset of the plurality of data lines has changed;
decreasing a voltage level applied to a particular access line of the plurality of access lines; and
sensing a state of each data line of a second subset of the plurality of data lines while applying the particular voltage level to the particular access line.

2. The method of claim 1, wherein decreasing the voltage level applied to the particular access line comprises decreasing the voltage level to a voltage level lower than or equal to the particular voltage level.

3. The method of claim 1, wherein each data line of the plurality of data lines corresponds to a respective string of series-connected memory cells of the plurality of strings of series-connected memory cells, and wherein each string of series-connected memory cells corresponding to a data line of the first subset of the plurality of data lines contains a pattern of data representative of a particular data state of a plurality of data states.

4. The method of claim 1, wherein sensing the state of any data line of the plurality of data lines comprises sensing a change of a property of that data line selected from a group consisting of a current of that data line and a voltage level of that data line.

5. The method of claim 4, wherein sensing the change of the property comprises comparing the property to a threshold value.

6. The method of claim 1, wherein sensing the state of any data line of the plurality of data lines comprises sensing whether that data line is isolated from or connected to a source.

7. A method of operating a memory, comprising:
for each data state of a plurality of data states, sensing a state of each canary data line of a respective subset of a plurality of canary data lines for that data state while increasing a voltage level applied to each access line of a plurality of access lines commonly connected to a plurality of strings of series-connected memory cells;
for each data state of the plurality of data states, determining a respective voltage level for that data state at which the state of each canary data line of its respective subset of the plurality of canary data lines has changed;
decreasing a voltage level applied to a particular access line of the plurality of access lines; and
sensing a state of each primary data line of a plurality of primary data lines while applying the respective voltage level for a particular data state of the plurality of data states to the particular access line.

8. The method of claim 7, further comprising:
sensing the state of each primary data line of the plurality of primary data lines while applying the respective voltage level for a different data state of the plurality of data states to the particular access line.

9. The method of claim 7, further comprising:
for each remaining data state of the plurality of data states, sensing the state of each primary data line of the plurality of primary data lines while applying the respective voltage level for that remaining data state to the particular access line.

10. The method of claim 7, further comprising:
for an additional data state higher than the plurality of data states, sensing a state of each canary data line of a respective subset of the plurality of canary data lines for the additional data state while increasing the voltage level applied to each access line of the plurality of access lines; and
for the additional data state, determining a respective voltage level for the additional data state at which the state of each canary data line of its respective subset of the plurality of canary data lines has changed.

11. The method of claim 7, further comprising:
determining a particular voltage level at which the state of each canary data line of the plurality of canary data lines and the state of each primary data line of the plurality of primary data lines has changed.

12. The method of claim 11, further comprising applying the particular voltage level to each access line of the plurality of access lines other than the particular access line while applying the respective voltage level for the particular data state to the particular access line.

13. The method of claim 7, further comprising:
repeating sensing the state of each primary data line of the plurality of primary data lines while applying the respective voltage level for the particular data state of the plurality of data states to the particular access line for each data state of the plurality of data state;
reducing the voltage level applied to each access line of the plurality of access lines, then increasing the voltage level applied to each access line of the plurality of access lines;
decreasing the voltage level applied to a different access line of the plurality of access lines; and
for each data state of the plurality of data states, sensing the state of each primary data line of the plurality of primary data lines while applying the respective voltage level for that data state of the plurality of data states to the different access line.

14. A method of operating a memory, comprising:
sensing a state of each data line of a plurality of data lines while increasing a voltage level applied to each access line of a plurality of access lines commonly connected to a plurality of strings of series-connected memory cells, wherein each string of series-connected memory cells corresponds to a respective data line of the plurality of data lines;
determining a particular voltage level at which the state of each data line of a first subset of the plurality of data lines has changed, wherein each corresponding string of series-connected memory cells for each data line of the first subset of the plurality of data lines is programmed to contain a pattern of data representative of a particular data state of a plurality of data states;
decreasing a voltage level applied to a particular access line of the plurality of access lines without decreasing a voltage level applied to each remaining access line of the plurality of access lines;
sensing a state of each data line of a second subset of the plurality of data lines while applying the particular voltage level to the particular access line; and
for each data line of the second subset of the plurality of data lines, deeming a memory cell of the corresponding string of series-connected memory cells for that data line to be programmed to the particular data state if that data line, after decreasing the voltage level applied to the particular access line, first changes state in response to applying the particular voltage level to the particular access line.

15. The method of claim 14, further comprising:
determining a different voltage level at which the state of each data line of a different subset of the plurality of data lines has changed, wherein each corresponding string of series-connected memory cells for each data line of the different subset of the plurality of data lines is programmed to contain a pattern of data representative of a different data state of the plurality of data states, wherein the different data state is a next higher data state of the plurality of data states to the particular data state;
sensing the state of each data line of the second subset of the plurality of data lines while applying the different voltage level to the particular access line; and
for each data line of the second subset of the plurality of data lines, deeming the memory cell of the corresponding string of series-connected memory cells for that data line to be programmed to the different data state if that data line, after decreasing the voltage level applied to the particular access line, first changes state in response to applying the different voltage level to the particular access line.

16. The method of claim 14, further comprising:
for each data state of the plurality of data states other than the particular data state, determining a respective voltage level at which the state of each data line of a respective subset of the plurality of data lines has changed, wherein each corresponding string of series-connected memory cells for each data line of the respective subset of the plurality of data lines is programmed to contain a pattern of data representative of that data state;
for each data state of the plurality of data states other than the particular data state, sensing the state of each data line of the second subset of the plurality of data lines while applying the respective voltage level to the particular access line for that data state; and
for each data state of the plurality of data states other than the particular data state, and for each data line of the second subset of the plurality of data lines, deeming the memory cell of the corresponding string of series-connected memory cells for that data line to be programmed to that data state if that data line, after decreasing the voltage level applied to the particular access line, first changes state in response to applying the respective voltage level for that data state to the particular access line.

17. The method of claim 14, wherein a string of series-connected memory cells programmed to contain the pattern of data representative of the particular data state comprises a string of series-connected memory cells having a memory cell of the string of series-connected memory cells programmed to contain the particular data state and each remaining memory cell of the string of series-connected memory cells programmed to contain a data state of the plurality of data states equal to or lower than the particular data state.

18. The method of claim 14, wherein a string of series-connected memory cells programmed to contain the pattern of data representative of the particular data state comprises a string of series-connected memory cells having at least one memory cell of the string of series-connected memory cells programmed to contain the particular data state and each remaining memory cell of the string of series-connected memory cells programmed to contain a lowest data state of the plurality of data states.

19. The method of claim 14, wherein a string of series-connected memory cells programmed to contain the pattern of data representative of the particular data state comprises a string of series-connected memory cells having each memory cell of the string of series-connected memory cells programmed to contain the particular data state.

20. A method of operating a memory, comprising:
for each data state of a plurality of data states, sensing a state of each canary data line of a respective subset of a plurality of canary data lines for that data state while increasing a voltage level applied to each access line of a plurality of access lines commonly connected to a plurality of strings of series-connected memory cells;
sensing a state of each primary data line of a plurality of primary data lines while increasing the voltage level applied to each access line of the plurality of access lines;
for each data state of the plurality of data states, determining a respective voltage level for that data state at which the state of each canary data line of its respective subset of the plurality of canary data lines has changed;
determining a particular voltage level at which the state of each canary data line of the plurality of canary data lines and each primary data line of the plurality of primary data lines has changed;
decreasing a voltage level applied to a particular access line of the plurality of access lines while applying the particular voltage level to each remaining access line of the plurality of access lines;
for each data state of the plurality of data states, sensing a state of each primary data line of the plurality of primary data lines while applying the respective voltage level for that data state to the particular access line; and
for each memory cell of the plurality of strings of series-connected memory cells connected to the particular access line:
if, after decreasing the voltage level applied to the particular access line, a corresponding primary data line of the plurality of primary data lines for that memory cell first changes state in response to applying the respective voltage level for a particular data state of the plurality of data states, determining a data state programmed into that memory cell to be the particular data state; and
if, after decreasing the voltage level applied to the particular access line, the corresponding primary data line for that memory cell does not change state in response to applying the respective voltage level for any data state of the plurality of data states, determining the data state programmed into that memory cell to be a data state higher than any data state of the plurality of data states.

21. The method of claim 20, wherein sensing the state of any primary data line comprises sensing a property of that primary data line selected from a group consisting of a current flow of that primary data line and a voltage level of that primary data line.

22. The method of claim 20, wherein applying the respective voltage level for each data state of the plurality of data states to the particular access line comprises applying these respective voltage levels in an order of increasing voltage levels.

23. The method of claim 20, wherein sensing the state of each canary data line of the respective subset of the plurality of canary data lines for a data state of the plurality of data states comprises canary data lines interleaved with canary data lines of the respective subset of the plurality of canary data lines for a different data state of the plurality of data states.

24. The method of claim 20, wherein sensing the state of each canary data line of the respective subset of the plurality of canary data lines for a data state of the plurality of data states comprises canary data lines interleaved with primary data lines of the plurality of primary data lines.

* * * * *